(12) United States Patent
Jo et al.

(10) Patent No.: US 10,714,495 B2
(45) Date of Patent: Jul. 14, 2020

(54) THREE-DIMENSIONAL SEMICONDUCTOR MEMORY DEVICES INCLUDING THROUGH-INTERCONNECTION STRUCTURES

(71) Applicant: SAMSUNG ELECTRONICS CO., LTD., Suwon-si, Gyeonggi-do (KR)

(72) Inventors: Kwonsoon Jo, Suwon-si (KR); Seo-Goo Kang, Seoul (KR); Younghwan Son, Hwaseong-si (KR); Kohji Kanamori, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/108,294

(22) Filed: Aug. 22, 2018

(65) Prior Publication Data
US 2019/0172838 A1 Jun. 6, 2019

(30) Foreign Application Priority Data
Dec. 1, 2017 (KR) .................. 10-2017-0164120

(51) Int. Cl.
| H01L 27/11582 | (2017.01) |
| H01L 27/1157 | (2017.01) |
| H01L 23/532 | (2006.01) |
| G11C 7/14 | (2006.01) |
| G11C 7/18 | (2006.01) |
| H01L 27/11573 | (2017.01) |
| H01L 27/11565 | (2017.01) |

(Continued)

(52) U.S. Cl.
CPC .......... *H01L 27/11582* (2013.01); *G11C 7/14* (2013.01); *G11C 7/18* (2013.01); *G11C 16/00* (2013.01); *H01L 23/5329* (2013.01); *H01L 23/53295* (2013.01); *H01L 27/1157* (2013.01); *H01L 27/11565* (2013.01); *H01L 27/11573* (2013.01); *H01L 27/11575* (2013.01); *G11C 5/025* (2013.01)

(58) Field of Classification Search
CPC combination set(s) only.
See application file for complete search history.

(56) References Cited

U.S. PATENT DOCUMENTS 8,178,917 B2   5/2012   Tanaka et al.
8,288,816 B2   10/2012  Komori et al.
(Continued)

*Primary Examiner* — Nduka E Ojeh
(74) *Attorney, Agent, or Firm* — F. Chau & Associates, LLC

(57) ABSTRACT

A three-dimensional semiconductor memory device includes a peripheral logic structure including a plurality of peripheral logic circuits disposed on a semiconductor substrate, a horizontal semiconductor layer disposed on the peripheral logic structure, an electrode structure including a plurality of electrodes and insulating layers vertically and alternately stacked on the horizontal semiconductor layer, and a through-interconnection structure penetrating the electrode structure and the horizontal semiconductor layer and including a through-plug connected to the peripheral logic structure. A sidewall of a first insulating layer of the insulating layers is spaced apart from the through-plug by a first distance. A sidewall of a first electrode of the electrodes is spaced apart from the through-plug by a second distance greater than the first distance.

19 Claims, 30 Drawing Sheets

(51) Int. Cl.
  *G11C 16/00* (2006.01)
  *H01L 27/11575* (2017.01)
  *G11C 5/02* (2006.01)

(56) References Cited

U.S. PATENT DOCUMENTS

| | | |
|---|---|---|
| 8,338,882 B2 | 12/2012 | Tanaka et al. |
| 9,111,591 B2 | 8/2015 | Tanzawa |
| 9,595,533 B2 | 3/2017 | Tanzawa et al. |
| 2011/0220987 A1* | 9/2011 | Tanaka .............. H01L 27/11578 257/324 |
| 2014/0061751 A1* | 3/2014 | Nakajima ............. H01L 27/088 257/314 |
| 2015/0371925 A1 | 12/2015 | Thimmegowda et al. |
| 2016/0133638 A1* | 5/2016 | Simsek-Ege ...... H01L 27/11524 257/314 |
| 2017/0084626 A1* | 3/2017 | Kim ..................... H01L 23/485 |
| 2017/0179153 A1* | 6/2017 | Ogawa ............. H01L 27/11524 |

* cited by examiner

THREE-DIMENSIONAL SEMICONDUCTOR MEMORY DEVICES INCLUDING THROUGH-INTERCONNECTION STRUCTURES

CROSS-REFERENCE TO RELATED APPLICATION

This U.S. non-provisional patent application claims priority under 35 U.S.C. § 119 to Korean Patent Application No. 10-2017-0164120, filed on Dec. 1, 2017, in the Korean Intellectual Property Office, the disclosure of which is incorporated by reference in its entirety herein.

BACKGROUND

1. Technical Field

Embodiments of the inventive concept relate to three-dimensional (3D) semiconductor memory devices and, more particularly, to 3D semiconductor memory devices with improved reliability and integration density.

2. Discussion of Related Art

Semiconductor devices have been highly integrated to provide excellent performance and low manufacturing costs. The integration density of semiconductor devices directly affects the costs of manufacturing. The integration density of two-dimensional (2D) or planar semiconductor devices is mainly determined by the area occupied by each unit memory cell. Therefore, the integration density of the 2D or planar semiconductor devices is greatly affected by the technique used for forming fine patterns. However, extremely high-priced apparatuses are needed to form these fine patterns.

SUMMARY

At least one embodiment of the inventive concept provides three-dimensional (3D) semiconductor memory devices with improved reliability and integration density.

In an exemplary embodiment of the inventive concept, a 3D semiconductor memory device includes a peripheral logic structure including a plurality of peripheral logic circuits disposed on a semiconductor substrate, a horizontal semiconductor layer disposed on the peripheral logic structure, an electrode structure including a plurality of electrodes and insulating layers vertically and alternately stacked on the horizontal semiconductor layer, and a through-interconnection structure penetrating the electrode structure and the horizontal semiconductor layer and including a through-plug connected to the peripheral logic structure. A sidewall of a first insulating layer of the insulating layers is spaced apart from the through-plug by a first distance, and a sidewall of a first electrode of the electrodes is spaced apart from the through-plug by a second distance greater than the first distance.

In an exemplary embodiment of the inventive concept, a 3D semiconductor memory device includes a peripheral logic structure including a plurality of peripheral logic circuits disposed on a semiconductor substrate, a horizontal semiconductor layer disposed on the peripheral logic structure, an electrode structure including a plurality of electrodes and insulating layers vertically and alternately stacked on the horizontal semiconductor layer, the electrode structure having a plurality of recess regions between the insulating layers vertically adjacent to each other, a through-insulating pattern penetrating a portion of the electrode structure and a portion of the horizontal semiconductor layer and filling the recess regions of the electrode structure, and a plurality of through-plugs penetrating the through-insulating pattern and connected to the peripheral logic structure.

In an exemplary embodiment of the inventive concept, a 3D semiconductor memory device includes a peripheral logic structure including a plurality of peripheral logic circuits disposed on a semiconductor substrate, a horizontal semiconductor layer disposed on the peripheral logic structure, an electrode structure including a plurality of electrodes and insulating layers vertically and alternately stacked on the horizontal semiconductor layer, and a through-interconnection structure penetrating the electrode structure and the horizontal semiconductor layer and including a through-plug connected to the peripheral logic structure. The through-plug is spaced apart from a sidewall of the horizontal semiconductor layer by a first distance, and the first distance is greater than a minimum distance between a sidewall of the electrode structure and the through-plug.

In an exemplary embodiment of the inventive concept, a 3D semiconductor memory device includes a peripheral logic structure including a plurality of peripheral logic circuits disposed on a semiconductor substrate, a horizontal semiconductor layer disposed on the peripheral logic structure, an electrode structure including a plurality of electrodes and insulating layers vertically and alternately stacked on the horizontal semiconductor layer, the electrode structure having an inclined sidewall, a through-insulating pattern penetrating a portion of the electrode structure and contacting the inclined sidewall of the electrode structure, and a through-plug penetrating the through-insulating pattern and connected to the peripheral logic structure.

BRIEF DESCRIPTION OF THE DRAWINGS

The inventive concepts will become more apparent in view of the attached drawings and accompanying detailed description.

DETAILED DESCRIPTION OF THE EXEMPLARY EMBODIMENTS

Hereinafter, exemplary embodiments of the inventive concept in conjunction with accompanying drawings will be described. Below, details, such as detailed configurations and structures, are provided to aid a reader in understanding embodiments of the inventive concept. Therefore, embodiments described herein may be variously changed or modified without departing from embodiments of the inventive concept.

Figure 1:
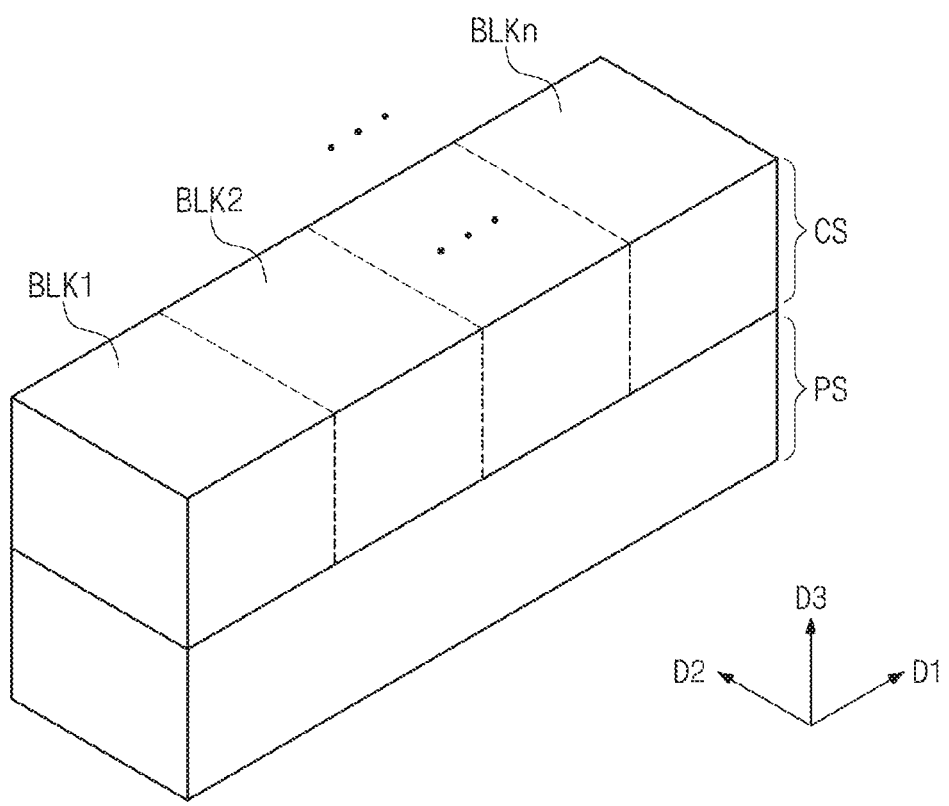
FIG. 1 is a perspective view schematically illustrating a three-dimensional (3D) semiconductor memory device according to an exemplary embodiment of the inventive concept.

FIG. 1 is a perspective view schematically illustrating a three-dimensional (3D) semiconductor memory device according to an exemplary embodiment of the inventive concept.

Referring to FIG. 1, a 3D semiconductor memory device according to an exemplary embodiment includes a peripheral logic structure PS and a cell array structure CS stacked on the peripheral logic structure PS. In other words, the cell array structure CS overlaps with the peripheral logic structure PS when viewed in a plan view.

In an exemplary embodiment, the peripheral logic structure PS includes row and column decoders, a page buffer and control circuits, which control the cell array structure CS of the 3D semiconductor memory device.

The cell array structure CS includes a plurality of memory blocks BLK1 to BLKn. In an embodiment, each of the memory blocks corresponds to a data erase unit. For example, if a portion of a memory block is to be erased, the entire memory block is erased to erase that portion. In an embodiment, each of the memory blocks BLK1 to BLKn includes a memory cell array having a three-dimensional structure or a vertical structure. The memory cell array may include a plurality of memory cells three-dimensionally arranged, a plurality of word lines, and a plurality of bit lines. The word lines and the bit lines may be electrically connected to the memory cells. The memory cell array having the 3D structure will be described hereinafter in detail with reference to the drawings.

Figure 2:
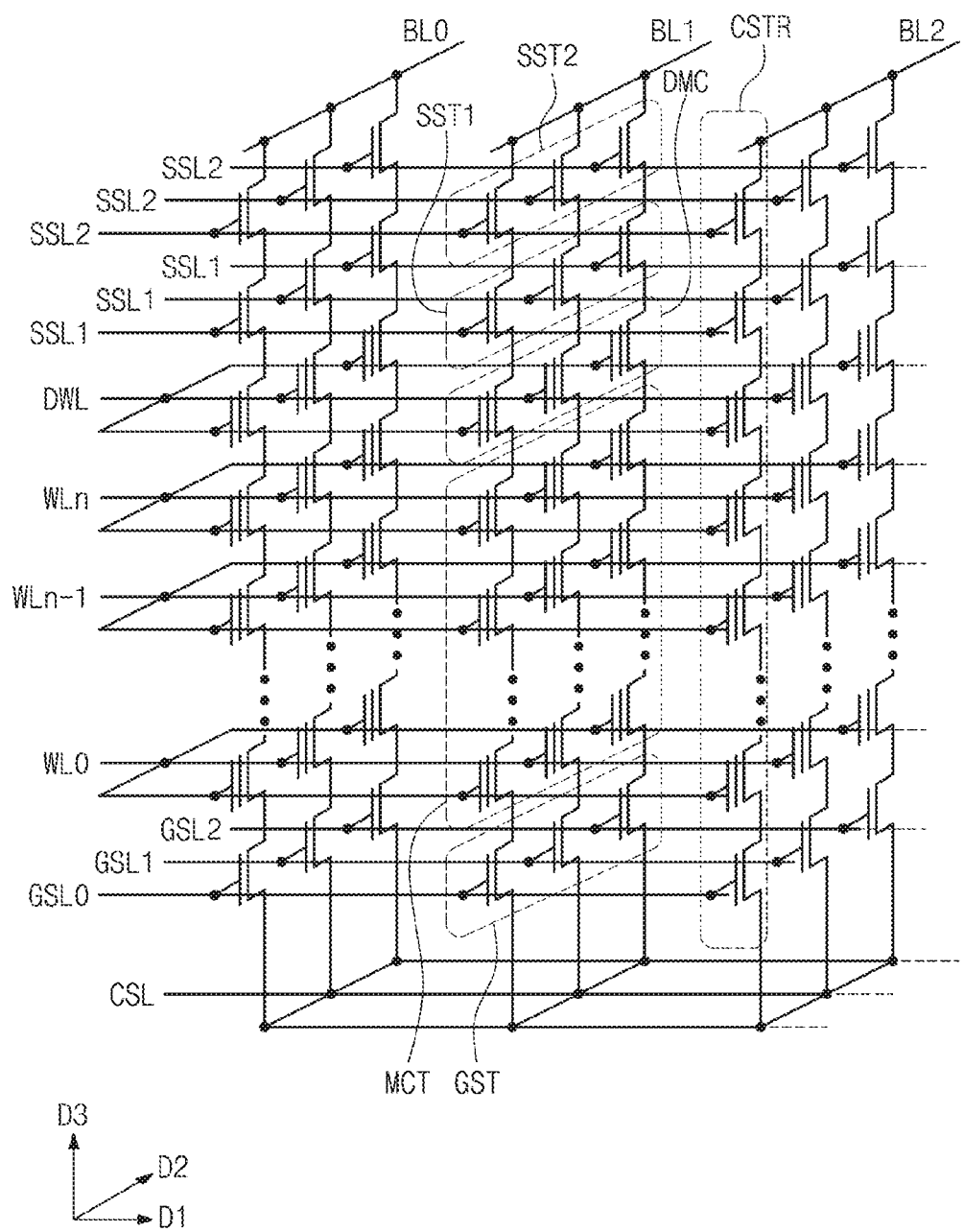
FIG. 2 is a schematic circuit diagram illustrating a cell array of a 3D semiconductor memory device according to an exemplary embodiment of the inventive concept.

FIG. 2 is a schematic circuit diagram illustrating a cell array of a 3D semiconductor memory device according to an exemplary embodiment of the inventive concept.

Referring to FIG. 2, the memory cell array of the 3D semiconductor memory device according to an exemplary embodiment includes a common source line CSL, a plurality of bit lines BL0 to BL2, and a plurality of cell strings CSTR connected between the common source line CSL and the bit lines BL0 to BL2.

The cell strings CSTR may be disposed on a plane defined by first and second directions D1 and D2 and may extend in a third direction D3. The bit lines BL0 to BL2 may be spaced apart from each other in the first direction D1 and may extend in the second direction D2.

A plurality of the cell strings CSTR may be connected in parallel to each of the bit lines BL0 to BL2. The cell strings CSTR may be connected in common to the common source line CSL. In other words, a plurality of the cell strings CSTR may be disposed between one common source line CSL and the plurality of bit lines BL0 to BL2. The common source line CSL may be provided in plurality, and the plurality of common source lines CSL may be two-dimensionally arranged. In an exemplary embodiment, the same voltage is applied to the plurality of common source lines CSL. In an exemplary embodiment, the common source lines CSL are electrically controlled independently of each other.

In some embodiments, each of the cell strings CSTR may include string selection transistors SST1 and SST2 connected in series to each other, memory cells MCT connected in series to each other, and a ground selection transistor GST. Each of the memory cells MCT may include a data storage element.

In some embodiments, each of the cell strings CSTR may include first and second string selection transistors SST1 and SST2 connected in series to each other. The second string selection transistor SST2 may be connected to one of the bit lines BL0 to BL2, and the ground selection transistor GST may be connected to the common source line CSL. The memory cells MCT may be connected in series between the first string selection transistor SST1 and the ground selection transistor GST.

In addition, each of the cell strings CSTR may further include a dummy cell DMC connected between the first string selection transistor SST1 and the memory cell MCT. Even though not shown in the drawings, an additional dummy cell may be connected between the ground selection transistor GST and the memory cell MCT adjacent to the ground selection transistor GST. In an exemplary embodiment, in each of the cell strings CSTR, the ground selection transistor GST includes a plurality of MOS transistors connected in series to each other, similar to the first and second string selection transistors SST1 and SST2. In certain embodiments, each of the cell strings CSTR may include a single string selection transistor.

In some embodiments, the first string selection transistor SST1 may be controlled by a first string selection line SSL1, and the second string selection transistor SST2 may be controlled by a second string selection line SSL2. The memory cells MCT may be controlled by a plurality of word lines WL0 to WLn, and the dummy cell DMC may be controlled by a dummy word line DWL. The ground selection transistor GST may be controlled by one of ground selection lines GSL0 to GSL2. The common source line CSL may be connected in common to sources of the ground selection transistors GST.

One cell string CSTR may include the plurality of memory cells MCT respectively disposed at different distances from the common source line CSL. The word lines WL0 to WLn and DWL may be disposed between the common source line CSL and the bit lines BL0 to BL2.

Gate electrodes of the memory cells MCT (or the dummy cells DMC) disposed at the same level from the common source line CSL may be connected in common to one of the word lines WL0 to WLn and DWL so as to be in an equipotential state. Alternatively, even though the gate electrodes of the memory cells MCT are disposed at substantially the same level from the common source line CSL, the gate electrodes disposed in one row (or one column) may be controlled independently of the gate electrodes disposed in another row (or another column).

The ground selection lines GSL0 to GSL2 and the string selection lines SSL1 and SSL2 may extend in the first direction D1 and may be spaced apart from each other in the second direction D2. The ground selection lines GSL0 to GSL2 disposed at substantially the same level from the common source line CSL may be electrically isolated from each other, and the string selection lines SSL1 or SSL2 disposed at substantially the same level from the common source line CSL may be electrically isolated from each other.

Figure 3:
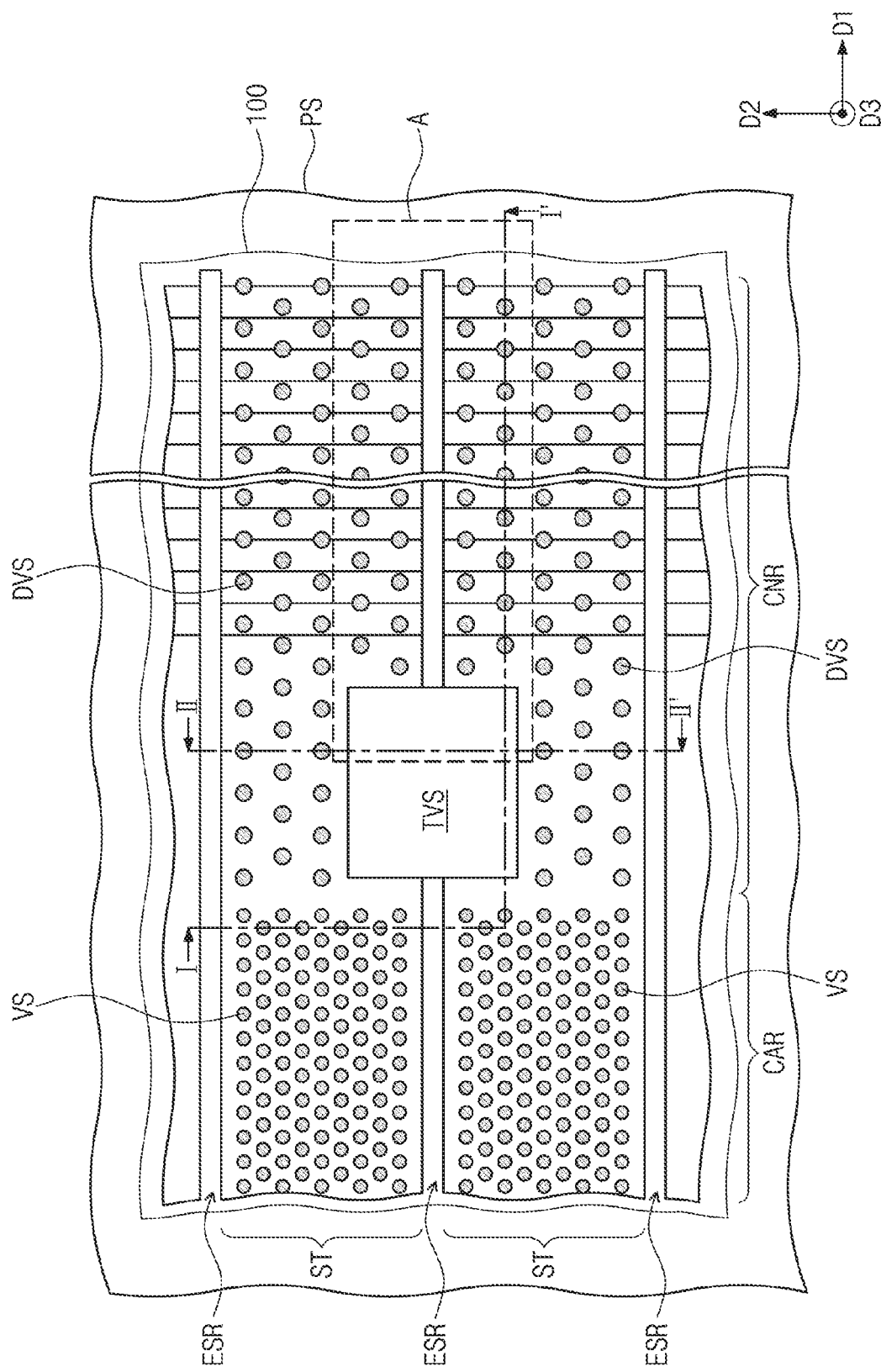
FIG. 3 is a schematic plan view illustrating a 3D semiconductor memory device according to an exemplary embodiment of the inventive concept.
Figure 4:
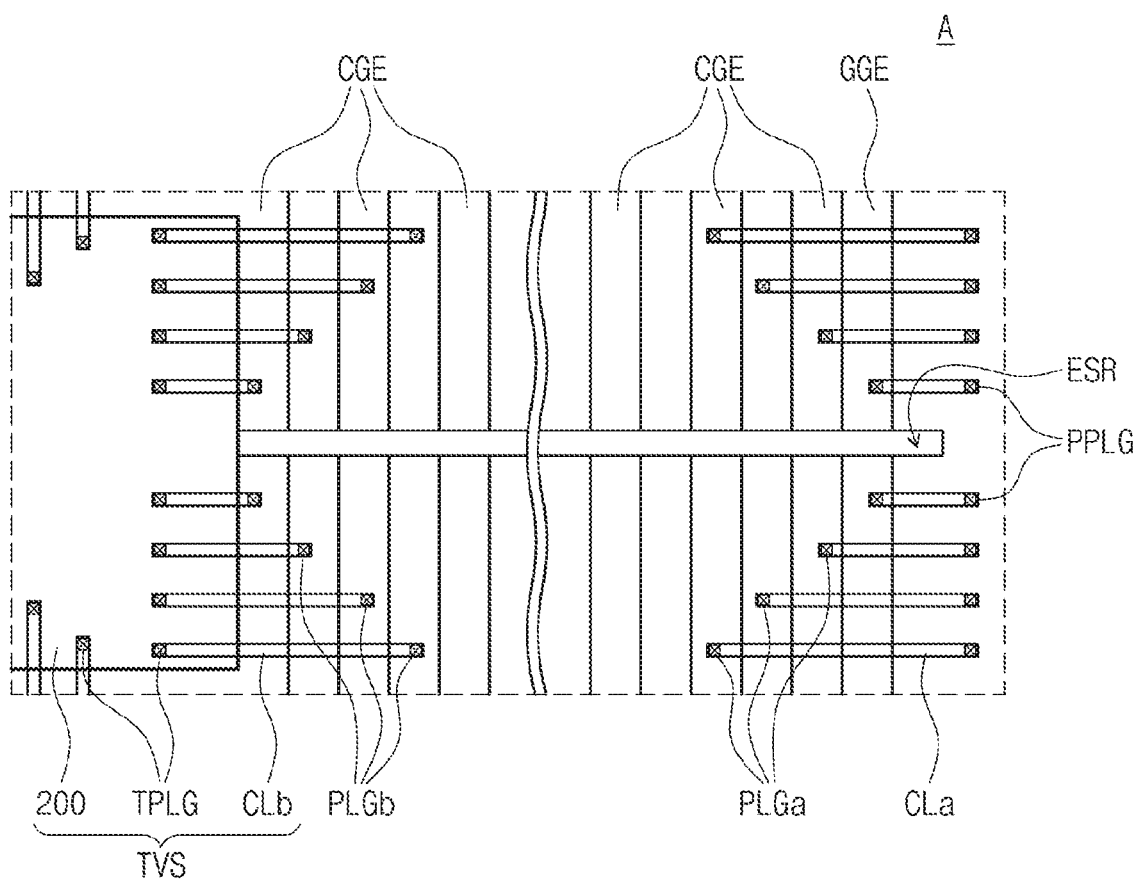
FIG. 4 is an enlarged plan view of a portion 'A' of FIG. 3 to illustrate a 3D semiconductor memory device according to an exemplary embodiment of the inventive concept.
Figure 5A:
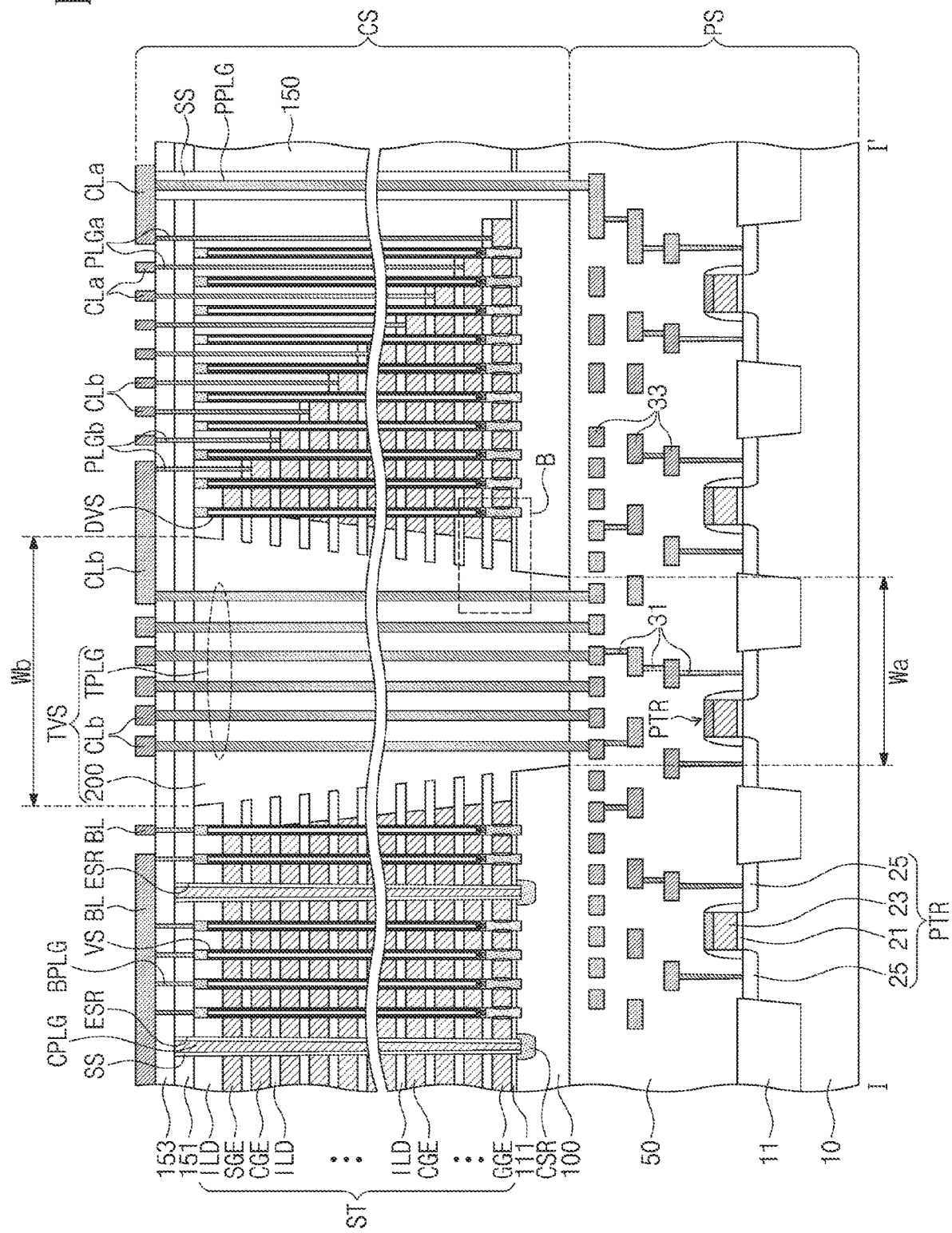
FIGS. 5A and 5B are cross-sectional views taken along lines I-I' and II-II' of FIG. 3, respectively, to illustrate a 3D semiconductor memory device according to an exemplary embodiment of the inventive concept.
Figure 5B:
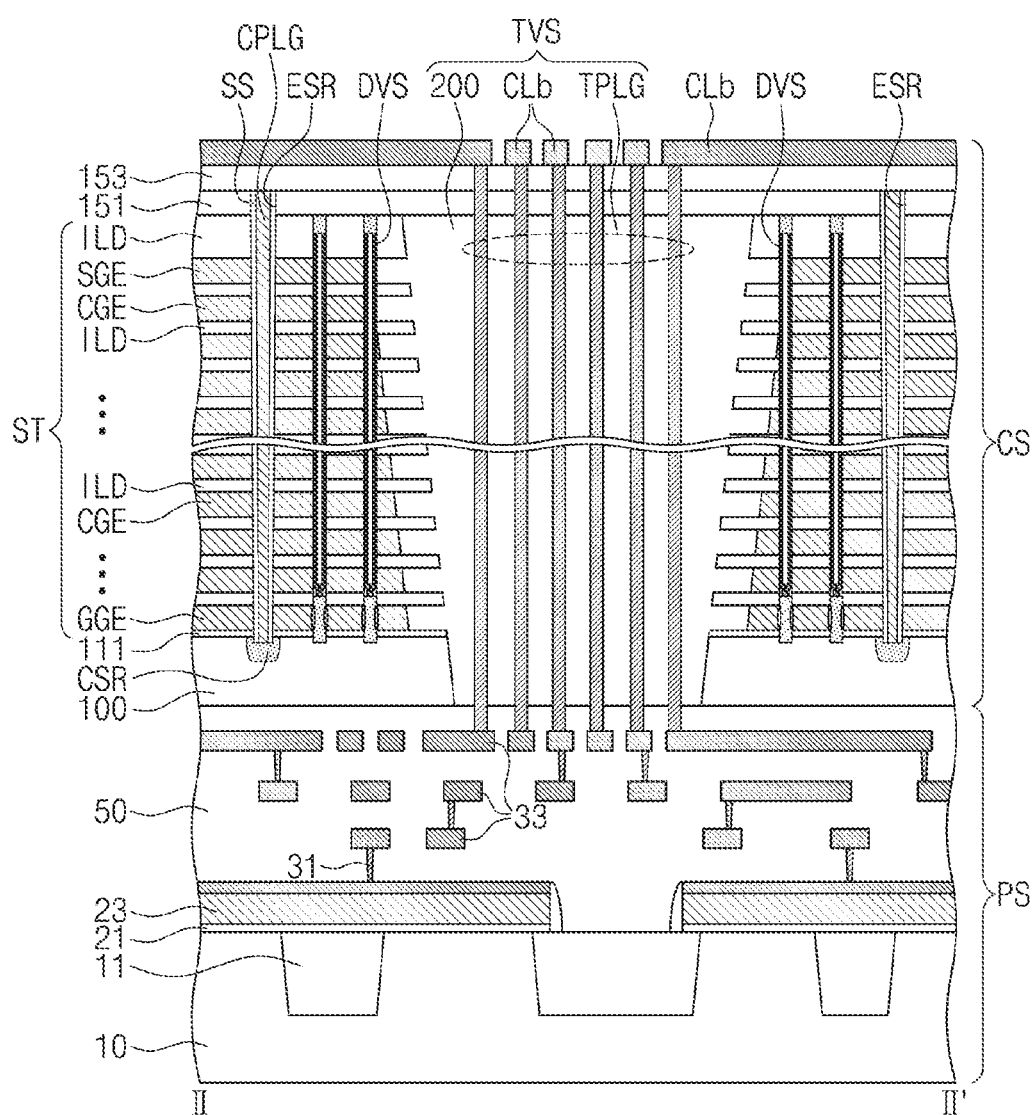
Figure 6A:
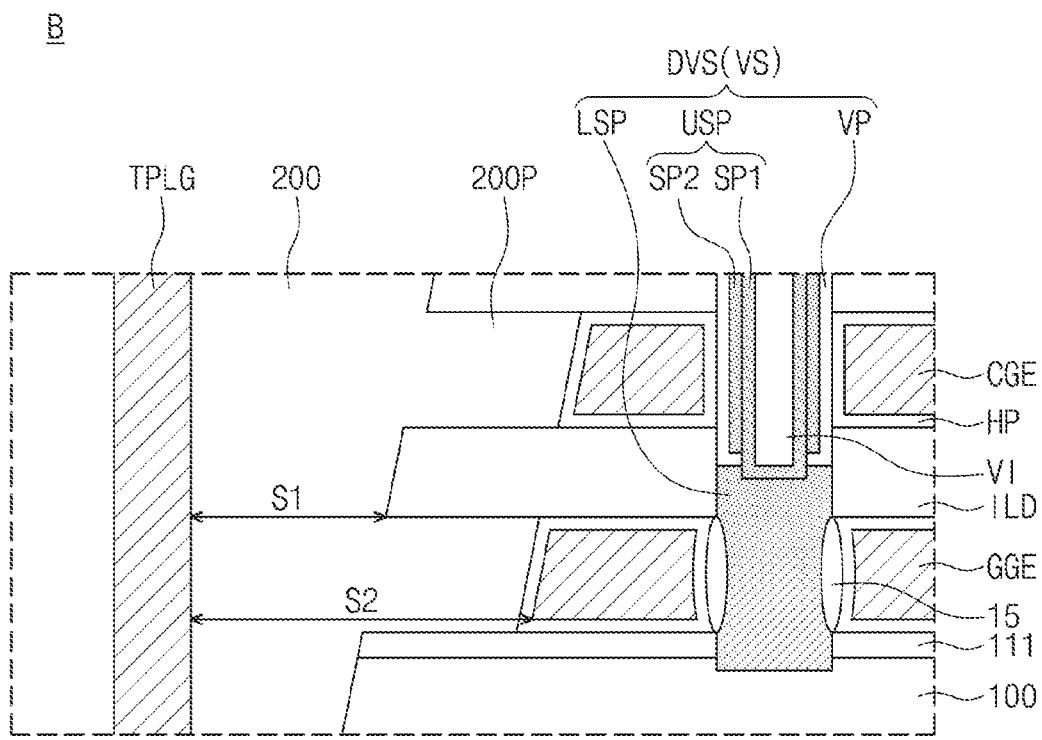
FIGS. 6A and 6B are enlarged views of a portion 'B' of FIG. 5A.
Figure 6B:
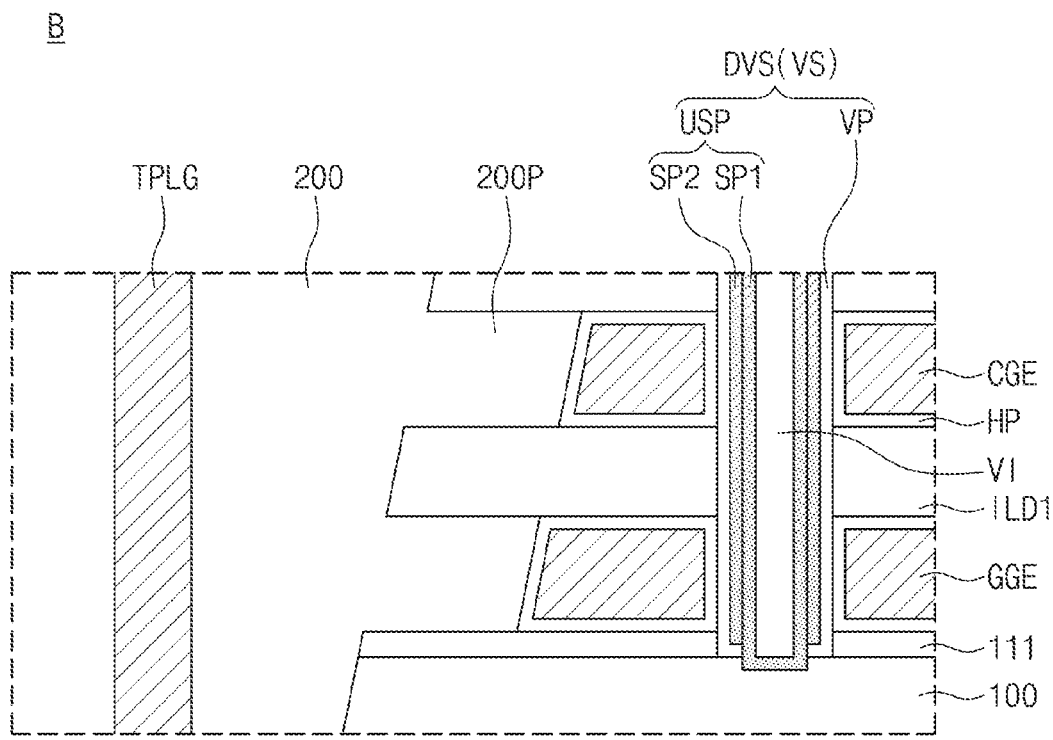

FIG. 3 is a schematic plan view illustrating a 3D semiconductor memory device according to an exemplary embodiment of the inventive concept. FIG. 4 is an enlarged plan view of a portion 'A' of FIG. 3 to illustrate a 3D semiconductor memory device according to an exemplary embodiment of the inventive concepts. FIGS. 5A and 5B are cross-sectional views taken along lines I-I' and II-II' of FIG. 3, respectively, to illustrate a 3D semiconductor memory device according to an exemplary embodiment of the inventive concept. FIGS. 6A and 6B are enlarged views of a portion 'B' of FIG. 5A.

Referring to FIGS. 3, 4, 5A and 5B, a 3D semiconductor memory device according to an exemplary embodiment includes a peripheral logic structure PS disposed on a semiconductor substrate 10, a cell array structure CS disposed on the peripheral logic structure PS, and a through-interconnection structure TVS that penetrates a portion of the cell array structure CS and connects the cell array structure CS to the peripheral logic structure PS.

The peripheral logic structure PS includes peripheral logic circuits PTR. The peripheral logic circuits PTR may be integrated on a top surface of the semiconductor substrate 10. A lower filling insulation layer 50 may cover the peripheral logic circuits PTR. In an embodiment, the peripheral logic circuits PTR are integrated on substantially the entire top surface of the semiconductor substrate 10.

The semiconductor substrate 10 may include a silicon substrate, a silicon-germanium substrate, a germanium substrate, or a single-crystalline epitaxial layer grown on a single-crystalline silicon substrate. The semiconductor substrate 10 may include active regions defined by a device isolation layer 11. For example, the active regions may be disposed between portions of the device isolation layer 11.

The peripheral logic circuits PTR may include the row and column decoders, the page buffer and the control circuits described above and may include N-type metal-oxide-semiconductor (NMOS) and P-type metal-oxide semiconductor (PMOS) transistors, low-voltage and high-voltage transistors and a resistor, which are integrated on the semiconductor substrate 10. In an embodiment, the peripheral logic circuits PTR include a peripheral circuit gate insulating layer 21 disposed on the semiconductor substrate 10, a peripheral circuit gate electrode 23 disposed on the peripheral circuit gate insulating layer 21, and source/drain regions 25 disposed in the active region at both sides of the peripheral circuit gate electrode 23. In an embodiment, peripheral circuit gate spacers are formed on both sidewalls of the peripheral circuit gate electrode 23. In an embodiment, a pair of source drain regions 25 in an active region includes one source region and one drain region.

In an embodiment, peripheral circuit interconnection lines 33 are electrically connected to the peripheral logic circuits PTR through peripheral circuit contact plugs 31. For example, the peripheral circuit contact plugs 31 and the peripheral circuit interconnection lines 33 may be connected to the NMOS and PMOS transistors. For example, the peripheral circuit contact plugs 31 and the peripheral circuit interconnection lines 33 may be connected to the NMOS and PMOS transistors through the source/drain regions 25.

The lower filling insulation layer 50 may be provided on an entire top surface of the semiconductor substrate 10. For example, the lower filling insulation layer 50 may cover the entire top surface of the semiconductor substrate 10. In an embodiment, the lower filling insulation layer 50 covers the peripheral logic circuits PTR, the peripheral circuit contact plugs 31 and the peripheral circuit interconnection lines 33 on the semiconductor substrate 10. The lower filling insulation layer 50 may include a plurality of stacked insulating layers. For example, the lower filling insulation layer 50 may include at least one of a silicon oxide layer, a silicon nitride layer, a silicon oxynitride layer, or a low-k dielectric layer. In an embodiment, a low-k material is a material with a small dielectric constant relative to silicon dioxide.

In an embodiment, the cell array structure CS overlaps with the peripheral logic structure PS when viewed in a plan view. The cell array structure CS may be disposed on the lower filling insulation layer 50 and may include a horizontal semiconductor layer 100, electrode structures ST, and cell structures VS and dummy vertical structures DVS.

In an embodiment, the horizontal semiconductor layer 100 is stacked on a top surface of the lower filling insulation layer 50. The horizontal semiconductor layer 100 includes a cell array region CAR on which memory cells are provided, and a connection region CNR on which contact plugs PLGa and PLGb and conductive lines CLa and CLb are provided. The contact plugs PLGa and PLGb and the conductive lines CLa and CLb are connected to the memory cells. In an embodiment, the cell strings CSTR illustrated in FIG. 2 are integrated on the cell array region CAR of the horizontal semiconductor layer 100.

The horizontal semiconductor layer 100 may be formed of a semiconductor material. For example, the horizontal semiconductor layer 100 may include at least one of silicon (Si), germanium (Ge), silicon-germanium (SiGe), gallium-arsenic (GaAs), indium-gallium-arsenic (InGaAs), or aluminum-gallium-arsenic (AlGaAs). The horizontal semiconductor layer 100 may include a semiconductor material doped with dopants of a first conductivity type and/or an intrinsic semiconductor material not doped with dopants. In an embodiment, the horizontal semiconductor layer 100 has a crystal structure including at least one of a single-crystalline structure, an amorphous structure, or a poly-crystalline structure.

A plurality of the electrode structures ST are disposed on the horizontal semiconductor layer 100 and may extend from the cell array region CAR onto the connection region CNR in a first direction D1. The electrode structures ST adjacent to each other may be spaced apart from each other by an electrode separation region ESR provided therebetween in a second direction D2 intersecting the first direction D1. Here, the first and second directions D1 and D2 may be parallel to a top surface of the horizontal semiconductor layer 100.

In an embodiment, each of the electrode structures ST include insulating layers ILD and electrodes GGE, CGE and SGE, which are alternately stacked in a third direction D3 (e.g., a vertical direction) perpendicular to the first and second directions D1 and D2. In an embodiment, each of the electrode structures ST, and the electrodes GGE, CGE and SGE are stacked to have a stepped structure on the connection region CNR. Thus, a height of each of the electrode structures ST on the connection region CNR may decrease as a horizontal distance from the cell array region CAR increases. In an embodiment, in each of the electrode structures ST, lengths of the electrodes GGE, CGE and SGE in the first direction D1 sequentially decrease as a vertical distance from the horizontal semiconductor layer 100 increases. Each of the electrodes GGE, CGE and SGE may have a pad portion on the connection region CNR. In an exemplary embodiment, the pad portion of each of the electrodes GGE, CGE and SGE is exposed by the insulating layer ILD disposed directly thereon the connection region CNR. The pad portions of the electrodes GGE, CGE and SGE may be located at positions horizontally and vertically different from each other.

In an embodiment, the electrodes of each of the electrode structures ST include a plurality of cell gate electrodes CGE vertically stacked, a plurality of ground selection gate electrodes GGE horizontally spaced apart from each other under the lowermost cell gate electrode CGE, and a plurality of string selection gate electrodes SGE horizontally spaced apart from each other on the uppermost cell gate electrode CGE. In each of the electrode structures ST, the ground selection gate electrodes GGE corresponding to the lowermost layer may be used as gate electrodes of the ground selection transistors GST (see FIG. 2) which control electrical connection between the common source line CSL (see FIG. 2) and the cell vertical structures VS. In each of the electrode structures ST, the string selection gate electrodes SGE corresponding to the uppermost layer may be used as gate electrodes of the string selection transistors SST (see FIG. 2) which control electrical connection between bit lines BL and the cell vertical structures VS. The cell gate electrodes CGE may be used as control gate electrodes (see WL0 to WL3 and DWL of FIG. 2) of the memory and dummy cells MCT and DMC (see FIG. 2).

According to an exemplary embodiment, the electrode structure ST has a sidewall adjacent to the through-interconnection structure TVS. In an embodiment, the sidewall of the electrode structure ST has recess regions, each of which is defined between the insulating layers ILD vertically adjacent to each other. Each of the recess regions may be defined by the vertically adjacent insulating layers ILD and the electrode GGE, CGE or SGE disposed between the vertically adjacent insulating layers ILD. In other words, sidewalls of the electrodes GGE, CGE and SGE which are adjacent to the through-interconnection structure TVS may be laterally offset from sidewalls of the insulating layers ILD which are adjacent to the through-interconnection structure TVS.

A plurality of the cell vertical structures VS are provided on the cell array region CAR of the horizontal semiconductor layer 100, and the dummy vertical structures DVS are provided on the connection region CNR of the horizontal semiconductor layer 100. The cell vertical structures VS and the dummy vertical structures DVS may extend in the third direction D3 and may penetrate the electrode structures ST. The cell vertical structures VS or dummy vertical structures DVS constituting one row or one column may be arranged in a line or in a zigzag form along one direction when viewed in a plan view.

The cell vertical structures VS and dummy vertical structures DVS may include a semiconductor material such as silicon (Si), germanium (Ge), or a combination thereof. In addition, the vertical structures VS and DVS may include a semiconductor material doped with dopants or an intrinsic semiconductor material not doped with dopants. The cell vertical structures VS including the semiconductor material may be used as channels of the selection transistors SST and GST, the memory cells MCT and the dummy cell DMC, described with reference to FIG. 2.

The dummy vertical structures DVS may penetrate the stepped structure of the electrode structure ST. In other words, the dummy vertical structures DVS may penetrate the pad portions of the electrodes GGE, CGE and SGE on the connection region CNR. In an embodiment, lengths of the dummy vertical structures DVS are substantially equal or exactly equal to lengths of the cell vertical structures VS, and widths of the dummy vertical structures DVS are greater than widths of the cell vertical structures VS.

Referring to FIG. 6A, each of the cell vertical structures VS and dummy vertical structures DVS includes a lower semiconductor pattern LSP and an upper semiconductor pattern USP. The lower semiconductor pattern LSP may be an epitaxial pattern grown from the horizontal semiconductor layer 100. The lower semiconductor pattern LSP may have a pillar shape filling a lower region of a vertical hole. In an embodiment, a top surface of the lower semiconductor pattern LSP is higher than a top surface of the ground selection gate electrode GGE corresponding to the lowermost layer.

In an embodiment, a gate insulating layer 15 is disposed on a portion of a sidewall of the lower semiconductor pattern LSP. The gate insulating layer 15 may be disposed between the lowermost electrode GGE and the lower semiconductor pattern LSP. The gate insulating layer 15 may include a silicon oxide layer (e.g., a thermal oxide layer). In an embodiment, the gate insulating layer 15 has a rounded sidewall. In an embodiment, a portion of the gate insulating layer 15 has a convex shape.

The upper semiconductor pattern USP is connected to the lower semiconductor pattern LSP and may include silicon (Si), germanium (Ge), or a combination thereof. A bit line conductive pad may be provided on a top end of the upper semiconductor pattern USP. The bit line conductive pad may be a dopant region doped with dopants or may be formed of a conductive material. In an embodiment, the upper semiconductor pattern USP includes a first semiconductor pattern SP1 and a second semiconductor pattern SP2. The first semiconductor pattern SP1 is connected to the lower semiconductor pattern LSP and may have a pipe, cylindrical or macaroni shape having a closed bottom end. In an embodiment, the inside of the first semiconductor pattern SP1 is filled with a filling insulation pattern VI. The first semiconductor pattern SP1 electrically connects the second semiconductor pattern SP2 to the lower semiconductor pattern LSP. The second semiconductor pattern SP2 may have a pipe, cylindrical or macaroni shape of which top and bottom ends are open. In an embodiment, the second semiconductor pattern SP2 is not in contact with the lower semiconductor pattern LSP but is spaced apart from the lower semiconductor pattern LSP.

In an exemplary embodiment, as illustrated in FIG. 6B, the lower semiconductor pattern LSP is omitted from each of the cell vertical structures VS and dummy vertical structures DVS. In other words, each of the cell vertical structures VS and dummy vertical structures DVS include the first semiconductor pattern SP1 and the second semiconductor pattern SP2, like the upper semiconductor pattern USP described above. In this embodiment, the first semiconductor pattern SP1 is in direct contact with the horizontal semiconductor layer 100, and the inside of the first semiconductor pattern SP1 is filled with the filling insulation pattern VI.

In addition, referring to FIGS. 6A and 6B, a vertical insulating pattern VP may be disposed between the electrode structure ST and the semiconductor pattern (e.g., USP) of each of the cell vertical structures VS and dummy vertical structures DVS. The vertical insulating pattern VP may be included in each of the cell vertical structures VS and dummy vertical structures DVS. The vertical insulating pattern VP may have a pipe, cylindrical or macaroni shape of which top and bottom ends are open. The vertical insulating pattern VP may extend in the third direction D3. In an embodiment, the vertical insulating pattern VP surrounds a sidewall of the semiconductor pattern of each of the cell vertical structures VS and dummy vertical structures DVS. When each of the cell vertical structures VS and dummy vertical structures DVS includes the lower and upper semiconductor patterns LSP and USP, the vertical insulating pattern VP may surround a sidewall of the upper semiconductor pattern USP. In an embodiment, the vertical insulating pattern VP is at least a portion of a data storage layer. For example, the vertical insulating pattern VP may be a data storage layer of a NAND flash memory device and may include a tunnel insulating layer, a charge storage layer, and a blocking insulating layer. For example, the charge storage layer may include a trap insulating layer, a floating gate electrode, and/or an insulating layer including conductive nano dots. Alternatively, the vertical insulating pattern VP may include a thin layer for a phase-change memory cell or a thin layer for a variable resistance memory cell.

In an embodiment, a horizontal insulating pattern HP is disposed between a sidewall of each of the electrodes GGE, CGE and SGE and each of the cell vertical structures VS and dummy vertical structures DVS and may extend onto a top surface and a bottom surface of each of the electrodes GGE, CGE and SGE. In an embodiment, the horizontal insulating pattern HP is a portion of the data storage layer of the NAND flash memory device and may include a blocking insulating layer.

Referring back to FIGS. 3, 4, 5A and 5B, in an embodiment, the through-interconnection structure TVS penetrates portions of the electrode structures ST and a portion of the horizontal semiconductor layer 100. In an embodiment, the through-interconnection structure TVS is provided between a pair of the electrode structures ST and is surrounded by the pair of electrode structures ST, when viewed in a plan view. In an embodiment, the through-interconnection structure TVS is spaced apart from the stepped structure of the electrode structure ST and penetrates a portion of the electrode structure ST.

In an embodiment, the through-interconnection structure TVS includes a through-insulating pattern 200 penetrating a portion of the horizontal semiconductor layer 100 and intersecting the sidewalls of the electrode structures ST, through-plugs TPLG penetrating the through-insulating pattern 200, and conductive lines CLb connected to the through-plugs TPLG.

The through-insulating pattern 200 may be disposed on the lower filling insulation layer 50 and may extend in the third direction D3. In an embodiment, a bottom surface of the through-insulating pattern 200 is in contact with the lower filling insulation layer 50 of the peripheral logic structure PS, and the through-insulating pattern 200 covers the sidewalls of the electrode structures ST adjacent thereto. The through-insulating pattern 200 may be surrounded by the pair of electrode structures ST when viewed in a plan view.

In an embodiment, a top surface of the through-insulating pattern 200 is located at substantially the same level or exactly the same level as top surfaces of the cell vertical structures VS and dummy vertical structures DVS. In an embodiment, a height of the through-insulating pattern 200 in the third direction D3 is higher than a height of the electrode structure ST in the third direction D3. In an embodiment, a height of the through-insulating pattern 200 in the third direction D3 is substantially the same or exactly the same as a height of the electrode structure ST in the third direction D3. A width of the through-insulating pattern 200 may vary depending on a distance from the lower filling insulation layer 50.

In an embodiment, a bottom width Wa of the bottom surface of the through-insulating pattern 200 is less than a top width Wb of the top surface of the through-insulating pattern 200. The through-insulating pattern 200 may fill the recess regions, each of which is defined between the vertically adjacent insulating layers ILD in the electrode structure ST. In an exemplary embodiment, a sidewall of the through-insulating pattern 200 includes protrusions 200P which laterally protrude toward the electrodes GGE, CGE and SGE, as illustrated in FIG. 6A. In an embodiment, a sidewall of the protrusions is inclined. In an embodiment, the through-insulating pattern 200 is in contact with the horizontal insulating pattern HP including a portion of the data storage layer. For example, a protrusion 200P of the through-insulating pattern 200 may contact the horizontal insulating pattern HP. The through-insulating pattern 200 may be formed of an insulating material such as a silicon oxide layer or a low-k dielectric layer. In an embodiment, the through-insulating pattern 200 is formed of an insulating material different from that of the insulating layers ILD of the electrode structure ST.

In an embodiment, a plurality of the through-plugs TPLG penetrate the through-insulating pattern 200 so as to be connected to the peripheral circuit interconnection lines 33 of the peripheral logic structure PS. The through-plugs TPLG may be connected to at least some electrodes CGE and SGE of the electrode structures ST through the conductive lines CLb. In other words, the through-plugs TPLG may electrically connect at least some of the electrodes GGE, CGE and SGE to the peripheral circuit interconnection lines 33.

In an embodiment, since the sidewalls of the electrodes GGE, CGE and SGE are laterally recessed from the sidewalls of the insulating layers ILD, distances between the through-plug TPLG and the electrodes GGE, CGE and SGE are greater than distances between the through-plug TPLG and the insulating layers ILD. In an exemplary embodiment, as illustrated in FIG. 6A, one of the through-plugs TPLG is laterally spaced apart from the sidewall of the lowermost insulating layer ILD by a first distance S1 and is laterally spaced apart from the sidewall of the lowermost electrode GGE by a second distance S2 greater than the first distance S1.

Since the bottom width Wa of the through-insulating pattern 200 is less than the top width Wb of the through-insulating pattern 200, a distance between the through-plug TPLG and the uppermost one of the insulating layers ILD is greater than the distance between the through-plug TPLG and the lowermost one of the insulating layers ILD. Likewise, in an embodiment, a distance between the through-plug TPLG and the uppermost one SGE of the electrodes GGE, CGE and SGE is greater than the distance between the through-plug TPLG and the lowermost electrode GGE.

In an embodiment, the distances between the through-plug TPLG and the sidewalls of the insulating layers ILD sequentially increase as a vertical distance from the horizontal semiconductor layer 100 increases. Likewise, in an embodiment, the distances between the through-plug TPLG and the sidewalls of the electrodes GGE, CGE and SGE sequentially increase as a vertical distance from the horizontal semiconductor layer 100 increases. In an embodiment, the distances between the through-plug TPLG and the sidewalls of the electrodes GGE, CGE and SGE is greater than the minimum distance between the through-plug TPLG and the insulating layers ILD. In an embodiment, a distance between the through-plug TPLG and a sidewall of the horizontal semiconductor layer 100 is less than the minimum distance between the through-plug TPLG and the insulating layers ILD. In an embodiment, the minimum distance is the distance between the through-plug TPLG and the widest insulating layer ILD.

Referring to FIGS. 3, 4, 5A and 5B, in an embodiment, an upper filling insulation layer 150 covers end portions of the electrode structures ST, which have the stepped structures. First and second interlayer insulating layers 151 and 153 may be sequentially stacked on the upper filling insulation layer 150 and may cover the top surfaces of the cell vertical structures VS and dummy vertical structures DVS.

In an embodiment, common source regions CSR are provided in the horizontal semiconductor layer 100 under the electrode separation regions ESR between the electrode structures ST. The common source regions CSR may extend in parallel to the electrode separation regions ESR in the first direction D1. In an embodiment, the common source regions CSR include dopants of which a conductivity type is opposite to that of the horizontal semiconductor layer 100. For example, the common source regions CSR may include N-type dopants (e.g., arsenic (As) or phosphorus (P)).

In an embodiment, the electrode separation regions ESR are filled with an insulating material. In an embodiment, common source plugs CPLG penetrate the insulating material SS in the electrode separation regions ESR so as to be connected to the common source regions CSR.

Bit lines BL are disposed on the second interlayer insulating layer 153 of the cell array region CAR and may extend in the second direction D2 to intersect the electrode structures ST. In an embodiment, the bit lines BL are electrically connected to the cell vertical structures VS through bit line contact plugs BPLG.

In an embodiment, lower contact plugs PLGa are connected to the electrodes GGE and CGE provided in a lower region of the electrode structure ST, respectively. In an embodiment, the lower contact plugs PLGa are connected to connection contact plugs PPLG through first conductive lines CLa extending in the first direction D1. In an embodiment, the connection contact plugs PPLG are spaced apart from the electrode structures ST. In an embodiment, the connection contact plugs PPLG penetrate the upper filling insulation layer 150 and the horizontal semiconductor layer 100 so as to be connected to the peripheral circuit interconnection lines 33 of the peripheral logic structure PS. In an embodiment, sidewalls of the connection contact plugs PPLG are surrounded by an insulating material SS, like the through-plugs TPLG. In an embodiment, the electrodes GGE and CGE provided in the lower region of the electrode structure ST are electrically connected to the peripheral logic structure PS through the lower contact plug PLGa, the first conductive lines CLa, and the connection contact plugs PPLG.

In an embodiment, upper contact plugs PLGb penetrate the upper filling insulation layer 150 so as to be connected to the electrodes CGE and SGE provided in an upper region of the electrode structure ST. In an embodiment, the upper contact plugs PLGb are connected to the through-plugs TPLG through second conductive lines CLb extending in the first direction D1. In an embodiment, some of the first and second conductive lines CLa and CLb extend in the first direction D1, and others thereof extend in the second direction D2. In an embodiment, the electrodes CGE and SGE provided in the upper region of the electrode structure ST are electrically connected to the peripheral logic structure PS through the upper contact plug PLGb, the second conductive lines CLb, and the through-plugs TPLG.

Figure 7:
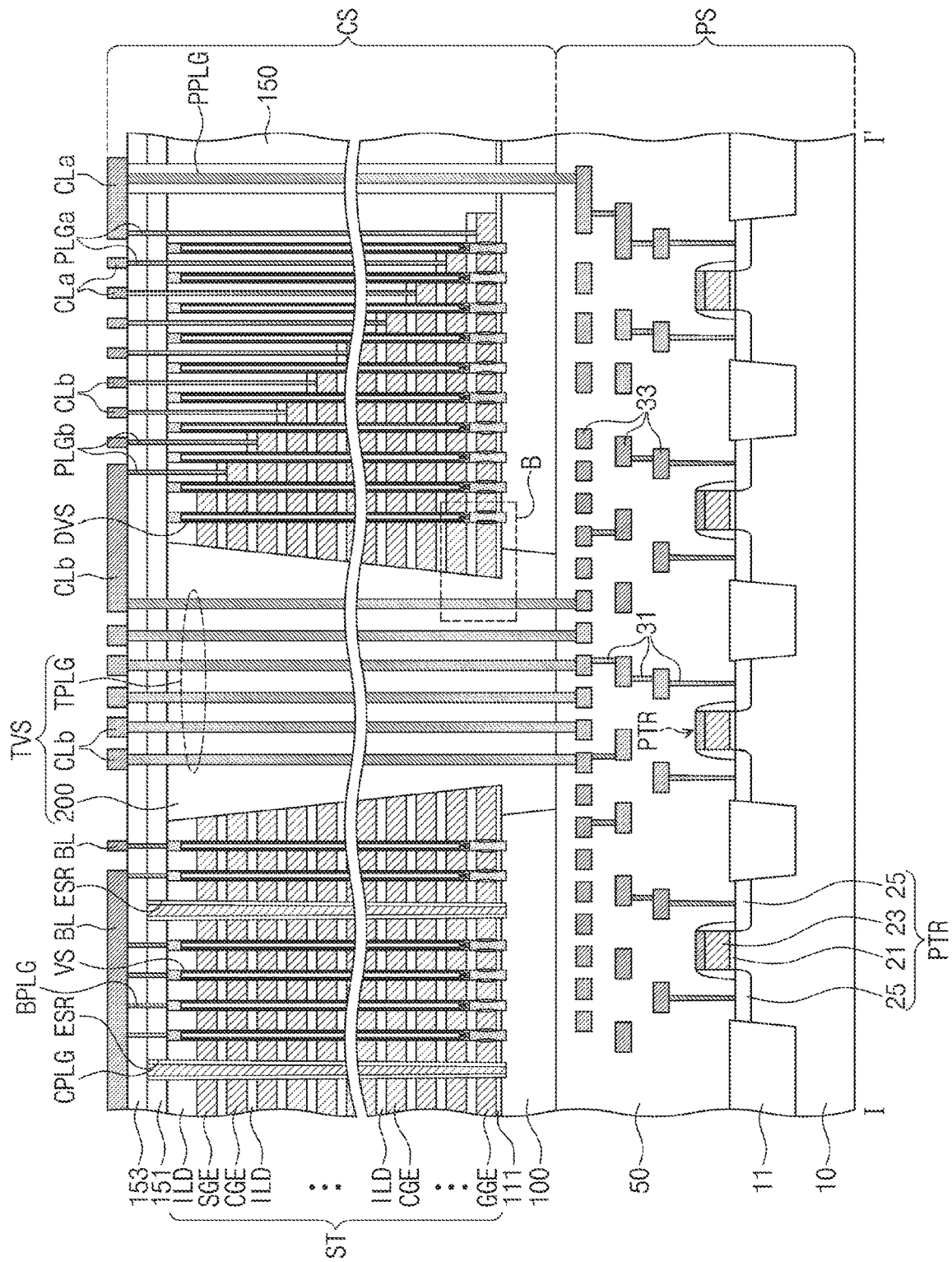
FIGS. 7, 9 and 11 are cross-sectional views illustrating 3D semiconductor memory devices according to an exemplary embodiment of the inventive concept.
Figure 8:
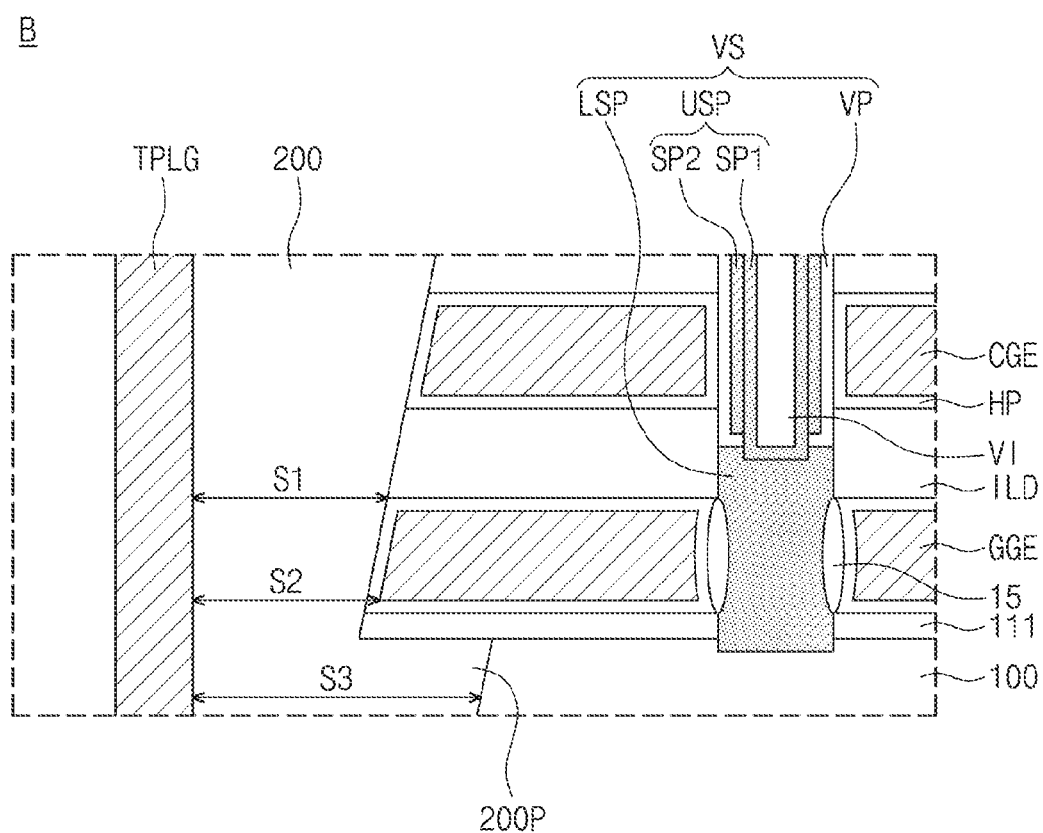
FIGS. 8, 10 and 12 are enlarged views of portions 'B' of FIGS. 7, 9 and 11, respectively.
Figure 9:
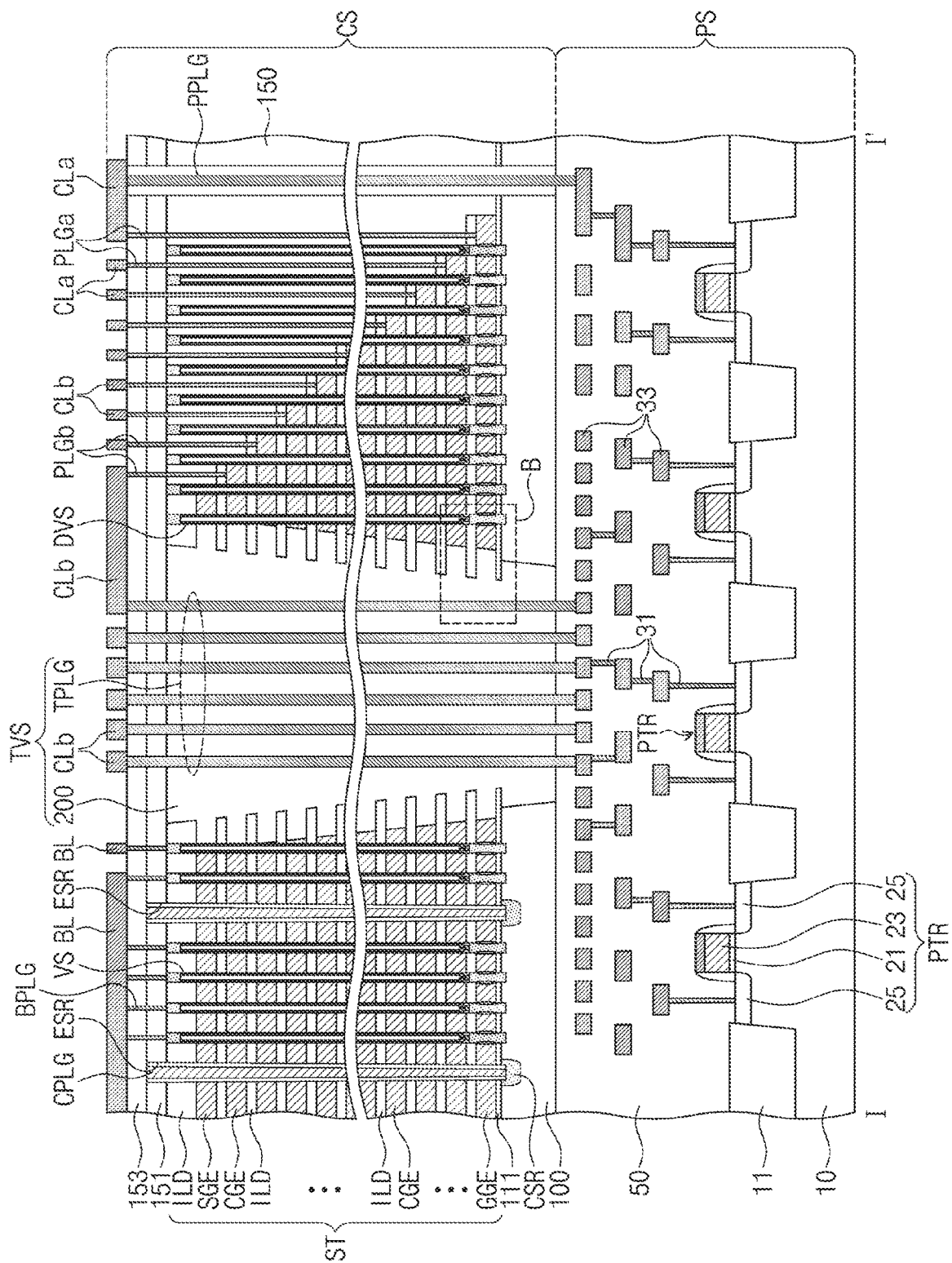
Figure 10:
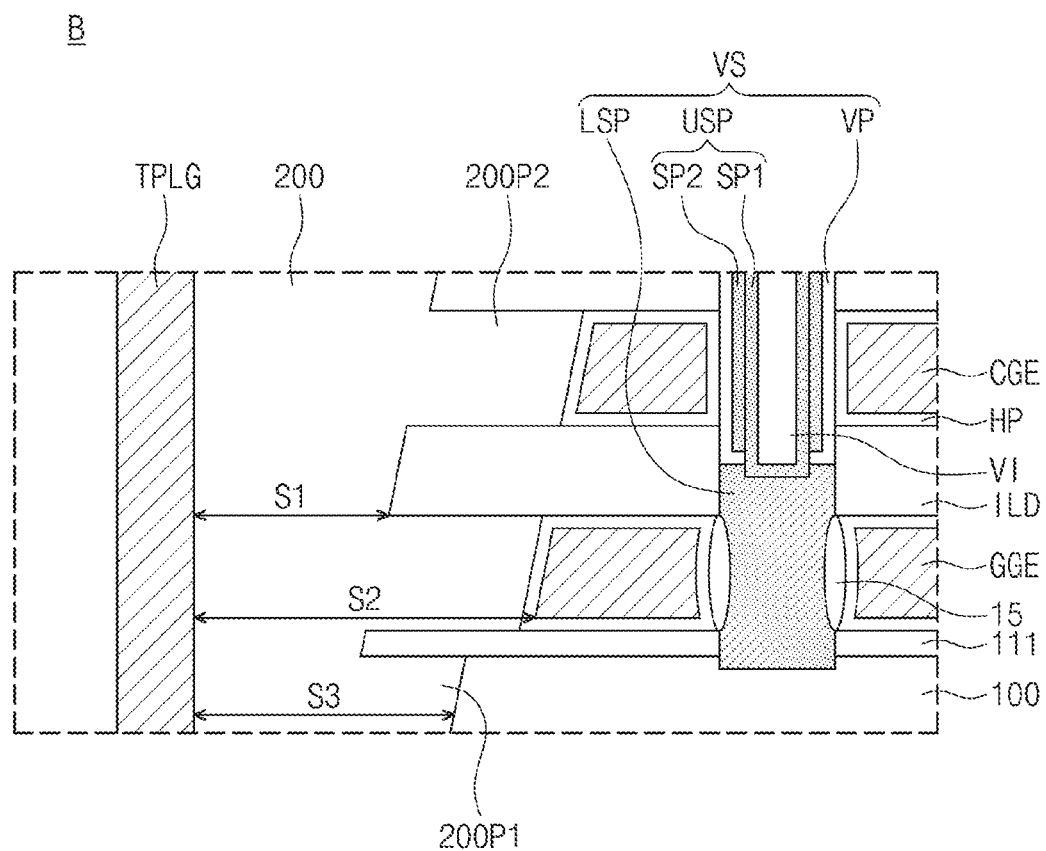
Figure 11:
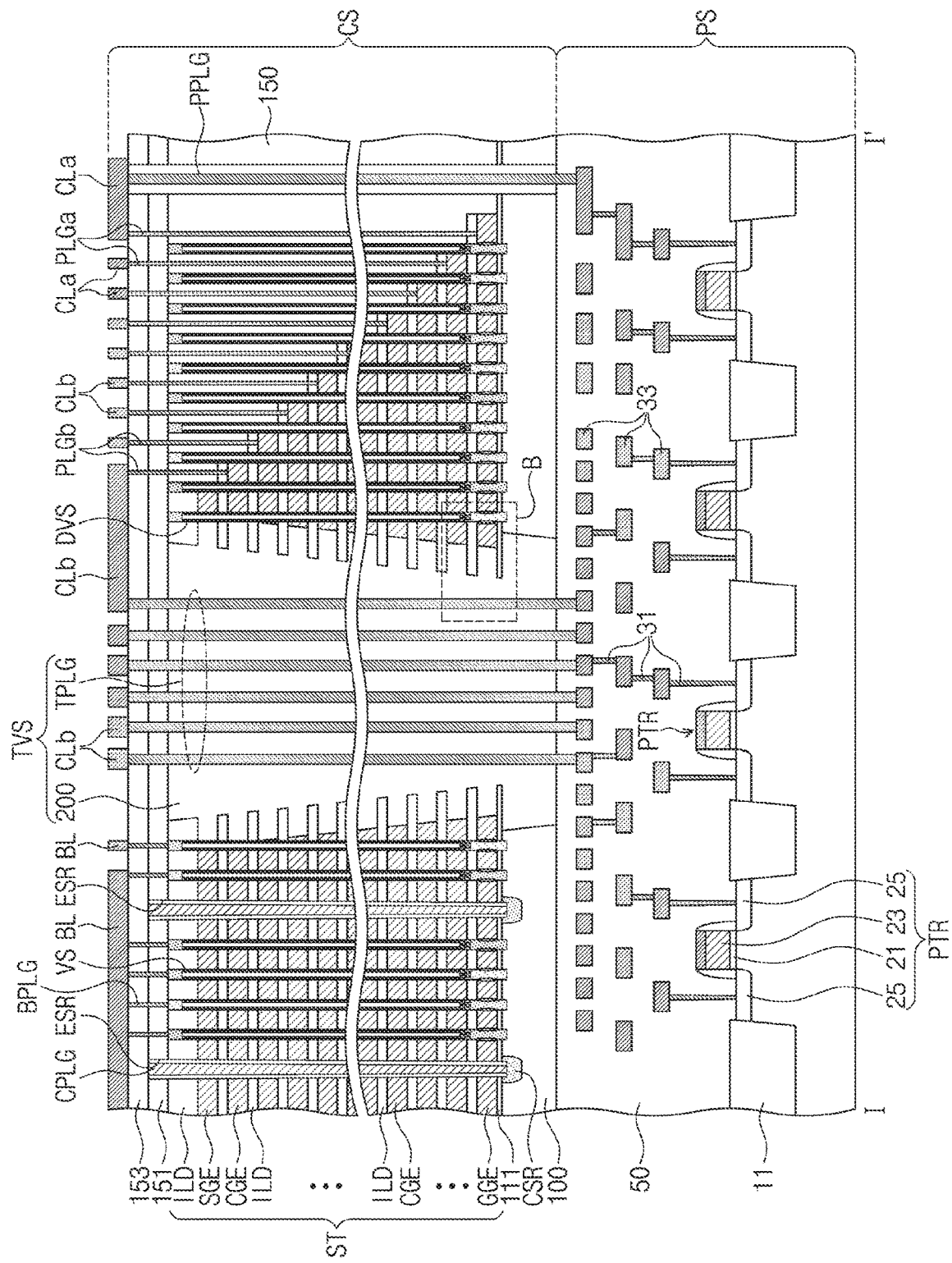
Figure 12:
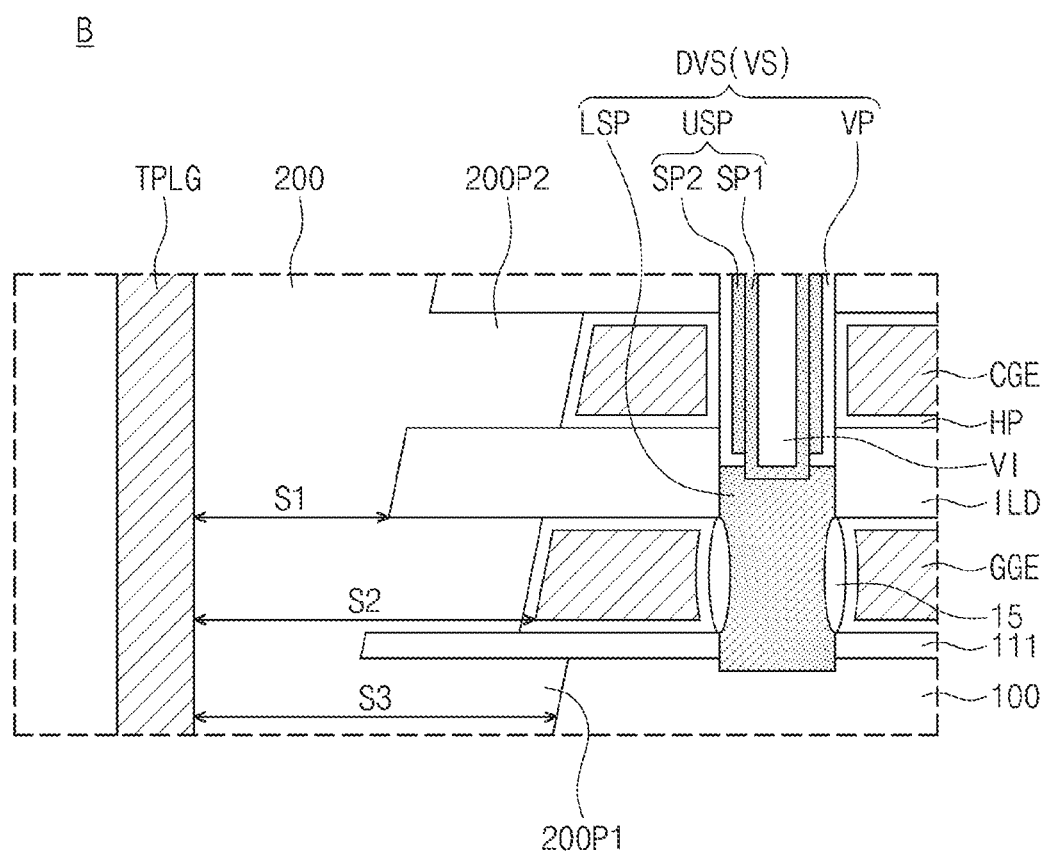

FIGS. 7, 9 and 11 are cross-sectional views illustrating 3D semiconductor memory devices according to some exemplary embodiments of the inventive concepts. FIGS. 8, 10 and 12 are enlarged views of portions 'B' of FIGS. 7, 9 and 11, respectively. For ease and convenience of explanation, the descriptions to the same technical features as in the above embodiments will be omitted or mentioned briefly, and differences between the present embodiments and the above embodiments will be mainly described hereinafter.

Referring to FIGS. 7 and 8, the electrode structure ST has an inclined sidewall, and the through-insulating pattern 200 is in contact with the inclined sidewall of the electrode structure ST. For example, the sidewall of the electrode structure ST may have a diagonal slant, where the electrode structure ST is adjacent the diagonal. In an embodiment, a portion (or an upper portion) of the through-insulating pattern 200, which penetrates the electrode structure ST, has a width that continuously increases from a bottom toward a top thereof. In an embodiment, a second distance S2 between the through-plug TPLG and a sidewall of the lowermost electrode GGE is less than a first distance S1 between the through-plug TPLG and a sidewall of the lowermost insulating layer ILD.

In the present embodiment, a sidewall of the horizontal semiconductor layer 100 is laterally recessed from a bottom portion of the inclined sidewall of the electrode structure ST. In an embodiment, the sidewall of the horizontal semiconductor layer 100 is spaced apart from the through-plug TPLG by a third distance S3, and the third distance S3 is greater than the first and second distances S1 and S2. In an embodiment, the third distance S3 between the horizontal semiconductor layer 100 and the through-plug TPLG is greater than the minimum distance between the inclined sidewall of the electrode structure ST and the through-plug TPLG. In an embodiment, the through-insulating pattern 200 includes a protrusion 200P that laterally protrudes toward the sidewall of the horizontal semiconductor layer 100. As a result, the distance between the through-plug TPLG and the horizontal semiconductor layer 100 is increased in a lower portion of the through-interconnection structure TVS, and thus an electrical short between the through-plug TPLG and the horizontal semiconductor layer 100 may be prevented.

Referring to FIGS. 9, 10, 11 and 12, the through-insulating pattern 200 includes a first protrusion 200P1 laterally protruding toward the sidewall of the horizontal semiconductor layer 100 and a second protrusions 200P2 laterally protruding toward the sidewalls of the electrodes GGE, CGE and SGE.

The through-plug TPLG is spaced apart from the sidewall of the lowermost insulating layer ILD by a first distance S1 and is spaced apart from the sidewall of the lowermost electrode GGE by a second distance S2. In an embodiment, the second distance S2 is greater than the first distance S1.

In addition, the through-plug TPLG is spaced apart from the sidewall of the horizontal semiconductor layer 100 by a third distance S3. In an embodiment, the third distance S3 is different from the second distance S2. For an example, as illustrated in FIGS. 9 and 10, the third distance S3 between the through-plug TPLG and the sidewall of the horizontal semiconductor layer 100 is less than the second distance S2 between the through-plug TPLG and the sidewall of the lowermost electrode GGE. Alternatively, as illustrated in FIGS. 11 and 12, the third distance S3 between the through-plug TPLG and the sidewall of the horizontal semiconductor layer 100 is greater than the second distance S2 between the through-plug TPLG and the sidewall of the lowermost electrode GGE.

Figure 13:
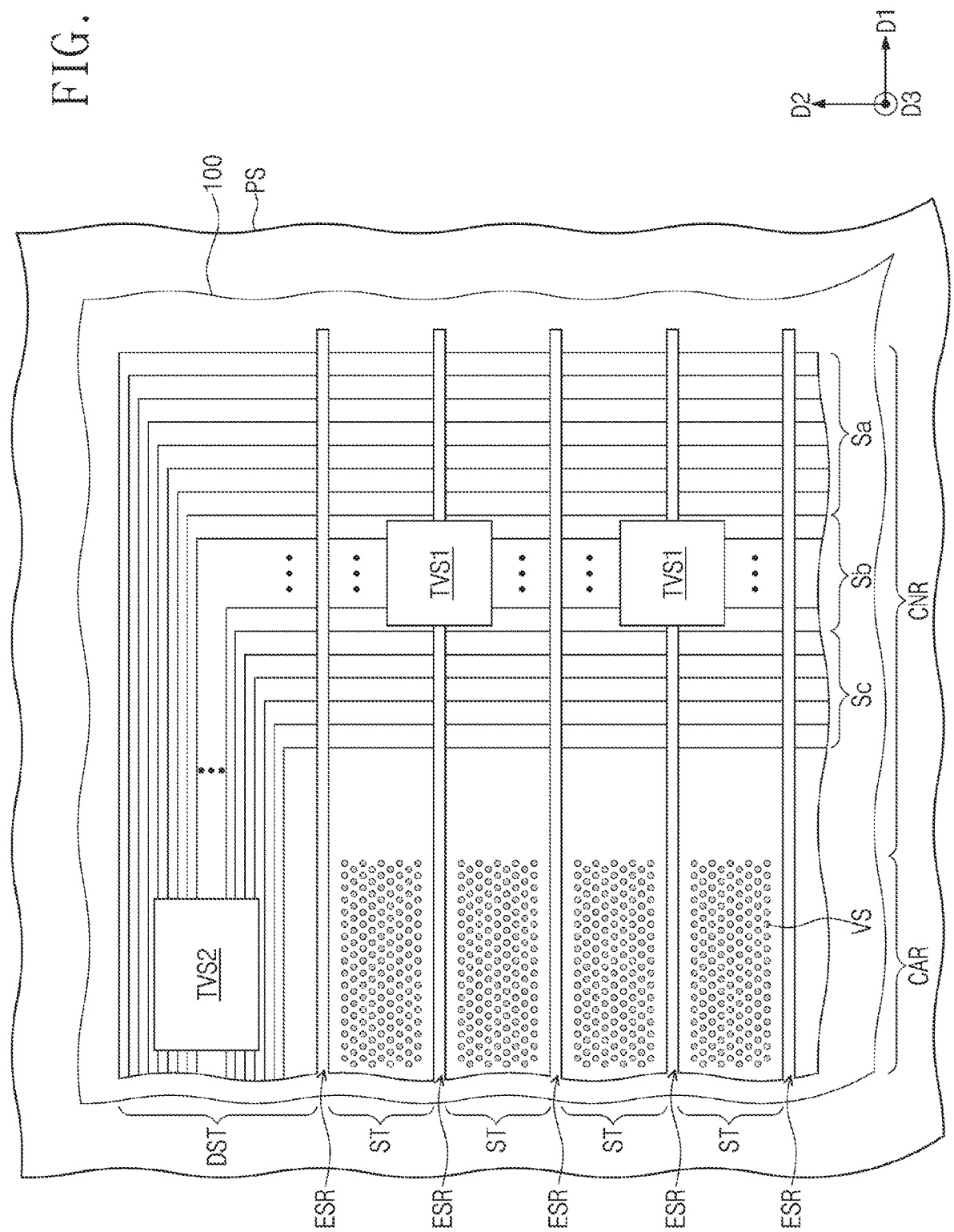
FIG. 13 is a schematic plan view illustrating a 3D semiconductor memory device according to an exemplary embodiment of the inventive concept.
Figure 14:
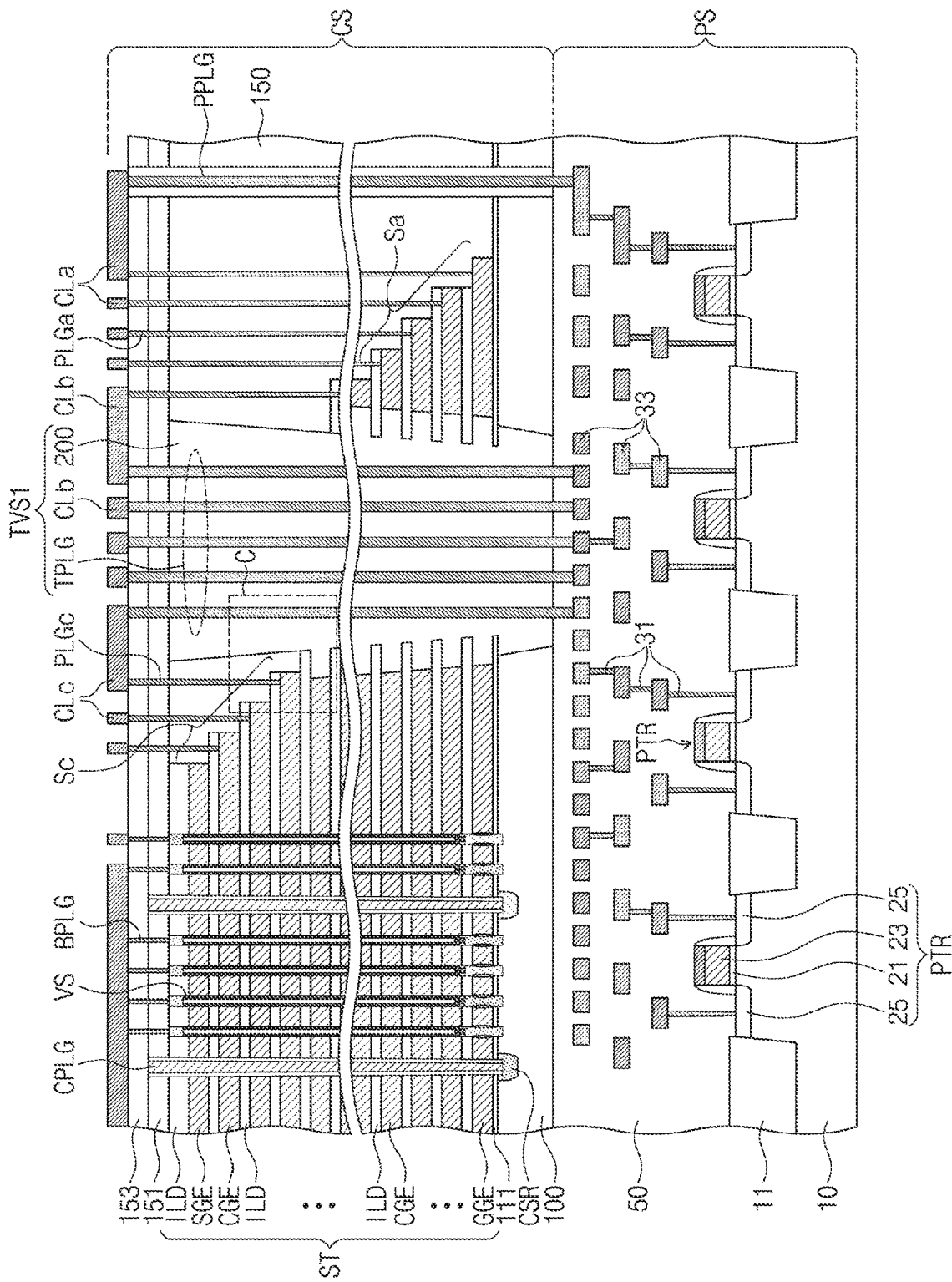
FIG. 14 is a cross-sectional view of the 3D semiconductor memory device of FIG. 13.
Figure 15:
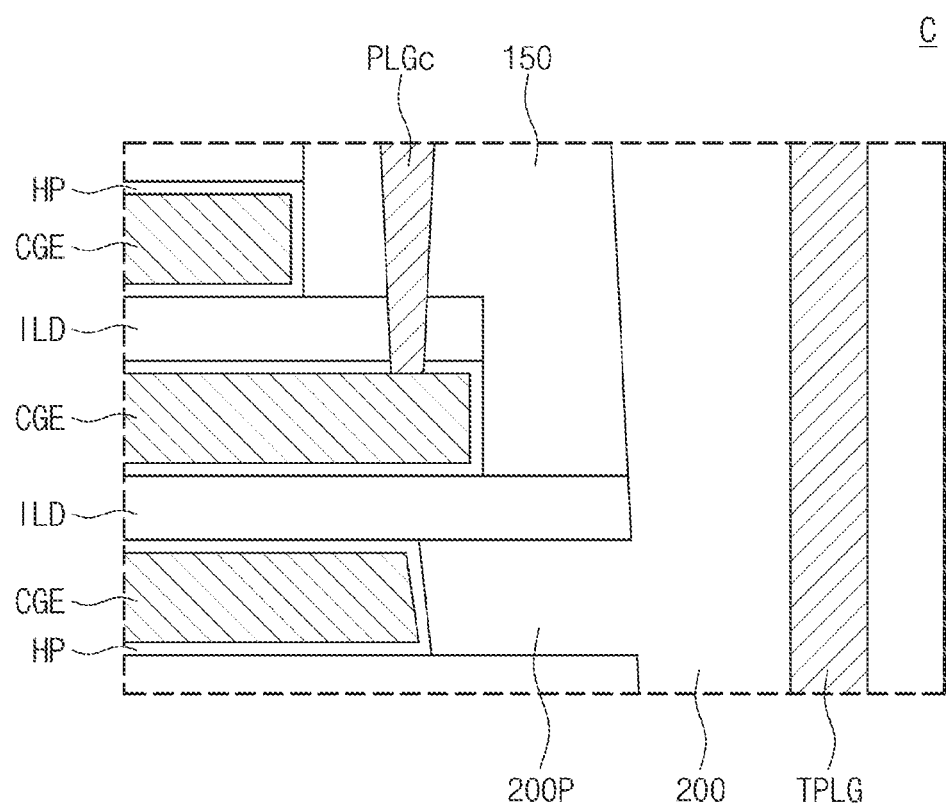
FIG. 15 is an enlarged view of a portion 'C' of FIG. 14.

FIG. 13 is a schematic plan view illustrating a 3D semiconductor memory device according to an exemplary embodiment of the inventive concept. FIG. 14 is a cross-sectional view of the 3D semiconductor memory device of FIG. 13. FIG. 15 is an enlarged view of a portion 'C' of FIG. 14. For ease and convenience of explanation, the descriptions to the same technical features as in the above embodiments will be omitted or mentioned briefly, and differences between the present embodiments and the above embodiments will be mainly described hereinafter.

Referring to FIGS. 13, 14 and 15, a plurality of the electrode structures ST and a dummy electrode structure DST are disposed on the horizontal semiconductor layer 100. In an embodiment, the dummy electrode structure DST is spaced apart from the outermost electrode structure ST in the second direction D2.

The dummy electrode structure DST may extend in the first direction D1 and may have a stepped structure formed along the first direction D1 and a stepped structure formed along the second direction D2. In an embodiment, the dummy electrode structure DST includes insulating layers and dummy electrodes which are alternately stacked on the horizontal semiconductor layer 100, like the electrode structures ST. In an embodiment, in the dummy electrode structure, lengths of the dummy electrodes in the first direction D1 sequentially decrease as a vertical distance from the horizontal semiconductor layer 100 increases, and lengths of the dummy electrodes in the second direction D2 also sequentially decrease as a vertical distance from the horizontal semiconductor layer 100 increases. In other words, areas of the dummy electrodes may sequentially decrease as a vertical distance from the horizontal semiconductor layer 100 increases.

The electrode structures ST may extend in the first direction D1 and may have the stepped structures formed along the first direction D1 on the connection region CNR, as described above. In an embodiment, each of the electrode structures ST includes a lower stepped structure Sa, an intermediate stepped structure Sb and an upper stepped structure Sc, which are sequentially provided in the first direction D1. In an embodiment, the electrode structure ST includes a lower region, an intermediate region and an upper region, which are sequentially stacked in the third direction D3 perpendicular to the top surface of the horizontal semiconductor layer 100. The electrodes GGE and CGE provided in the lower region of the electrode structure ST may form the lower stepped structure Sa, and the electrodes CGE provided in the intermediate region of the electrode structure ST may form the intermediate stepped structure Sb. The electrodes CGE and SGE provided in the upper region of the electrode structure ST may form the upper stepped structure Sc.

In an embodiment, the cell vertical structures VS penetrate the electrode structures ST on the cell array region CAR. In addition, even though not shown in the drawings, the dummy vertical structures may penetrate the electrode structures ST on the connection region CNR, as described above.

In an embodiment, first and second through-interconnection structures TVS1 and TVS2 are provided to connect the cell array structure CS to the peripheral logic structure PS. As described above, each of the first and second through-interconnection structures TVS1 and TVS2 may include a through-insulating pattern 200 penetrating a portion of the horizontal semiconductor layer 100 and intersecting portions of the sidewalls of the electrode structures ST, through-plugs TPLG provided in the through-insulating pattern 200, and a plurality of conductive lines CLb connected to the through-plugs TPLG.

The first through-interconnection structure TVS1 may be provided between a pair of the electrode structures ST and may penetrate portions of the stepped structures of the electrode structures ST on the connection region CNR. The second through-interconnection structure TVS2 may be provided to penetrate a portion of the dummy electrode structure DST. In an embodiment, the first through-interconnection structure TVS1 electrically connects conductive lines CLc and CLb, which extend in the first direction D1 in the cell array structure CS, to the peripheral logic structure PS. The conductive lines CLc and CLb may be connected to the electrodes through contact plugs PLGc and PLGb. The second through-interconnection structure TVS2 may electrically connect conductive lines, which extend in the second direction D2 in the cell array structure CS, to the peripheral logic structure PS.

Referring to FIGS. 14 and 15, the through-insulating pattern 200 of the first through-interconnection structure TVS1 is disposed between the lower stepped structure Sa and the upper stepped structure Sc of each of the electrode structures ST and may penetrate a portion of the intermediate stepped structure Sb. In an embodiment, the first through-interconnection structure TVS1 is spaced apart from the electrodes CGE and SGE provided in the upper region of the electrode structure ST. In other words, the through-insulating pattern 200 of the first through-interconnection structure TVS1 may penetrate a portion of the upper filling insulation layer 150. The through-insulating pattern 200 includes protrusions 200P laterally protruding toward sidewalls of the electrodes GGE and CGE provided in the lower region and the intermediate region of the electrode structure ST. Likewise, the through-insulating pattern of the second through-interconnection structure TVS2 may include protrusions laterally protruding toward sidewalls of the dummy electrodes of the dummy electrode structure DST.

FIGS. 16 to 23 are cross-sectional views illustrating a method of manufacturing a 3D semiconductor memory device, according to an exemplary embodiment of the inventive concept. Hereinafter, a method of manufacturing a 3D semiconductor memory device according to an exemplary embodiment of the inventive concept will be described in detail with reference to FIGS. 3 and 16 to 23.

Figure 16:
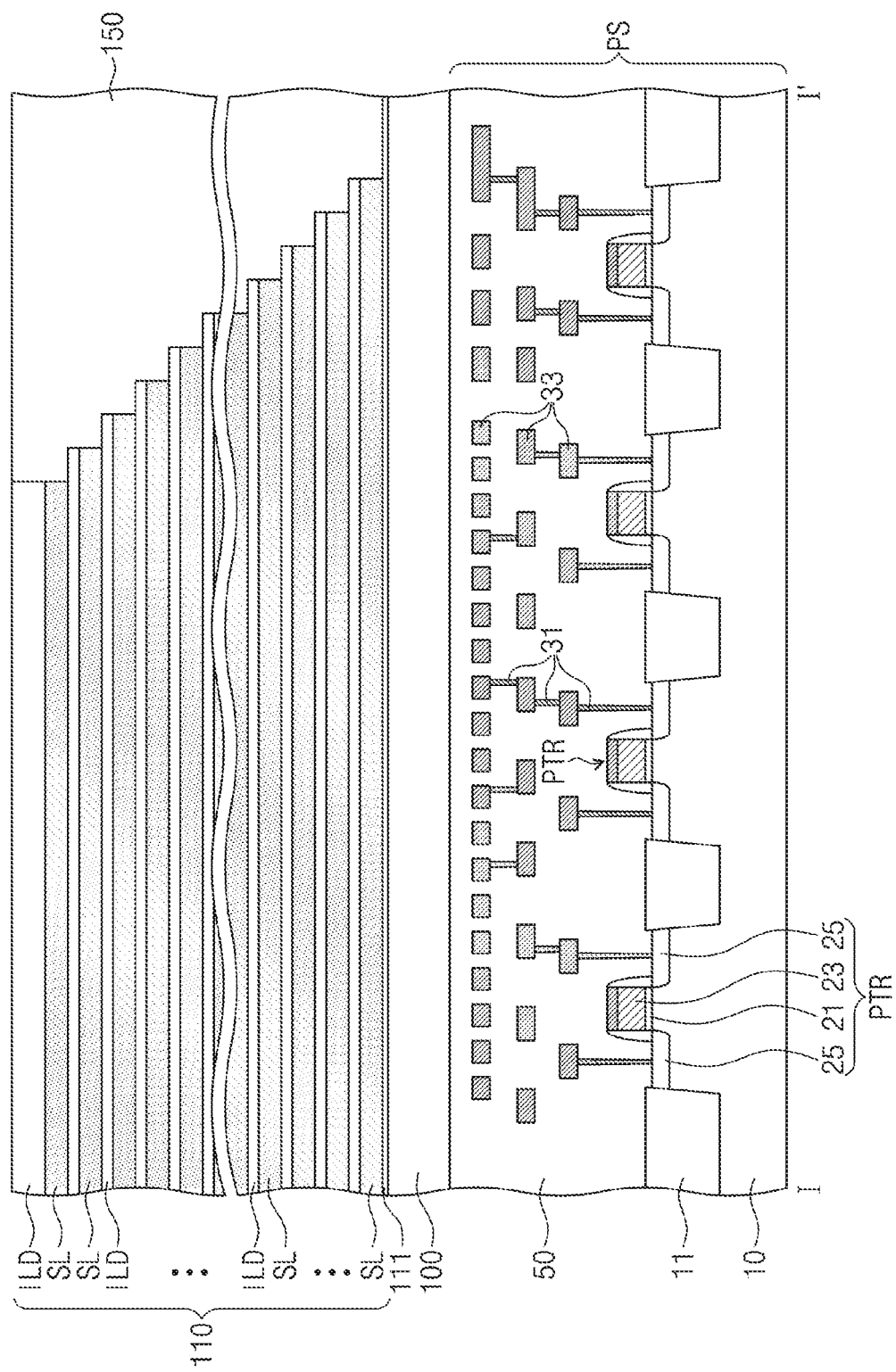
FIGS. 16 to 23 are cross-sectional views illustrating a method of manufacturing a 3D semiconductor memory device, according to an exemplary embodiment of the inventive concept.

Referring to FIGS. 3 and 16, a peripheral logic structure PS is formed on a semiconductor substrate 10. The semiconductor substrate 10 may be, for example, a silicon substrate having a first conductivity type (e.g., a P-type). A device isolation layer 11 is formed in the semiconductor substrate 10 to define active regions. For example, an active region may be disposed between portions of the device isolation layer 11.

In an embodiment, the formation of the peripheral logic structure PS includes forming peripheral logic circuits PTR on the semiconductor substrate 10, forming peripheral interconnection structures 31 and 33 connected to the peripheral logic circuits PTR, and forming a lower filling insulation layer 50. For example, the lower filling insulation layer 50 may be formed on the device isolation layer 11 and on the peripheral logic circuits PTR. Here, the peripheral logic circuits PTR may include MOS transistors using the semiconductor substrate 10 as channels. In an embodiment, the formation of the peripheral logic circuits PTR includes forming a peripheral circuit gate insulating layer 21 and a peripheral circuit gate electrode 23 which are sequentially stacked on the semiconductor substrate 10, and forming source/drain regions 25 by injecting dopants into the semiconductor substrate 10 at both sides of the peripheral circuit gate electrode 23. In an embodiment, peripheral circuit gate spacers are formed on both sidewalls of the peripheral circuit gate electrode 23. In an embodiment, a pair of the source drain regions 25 in an active region includes one source region and one drain region.

The lower filling insulation layer 50 may include one insulating layer or a plurality of stacked insulating layers, which covers the peripheral logic circuits PTR. For example, the lower filling insulation layer 50 may include at least one of a silicon oxide layer, a silicon nitride layer, a silicon oxynitride layer, or a low-k dielectric layer.

In an embodiment, the formation of the peripheral interconnection structures 31 and 33 includes forming peripheral circuit contact plugs 31 penetrating portions of the lower filling insulation layer 50, and forming peripheral circuit interconnection lines 33 connected to the peripheral circuit contact plugs 31.

In an embodiment, a horizontal semiconductor layer 100 is formed by depositing a semiconductor material on the lower filling insulation layer 50. The horizontal semiconductor layer 100 may have a single-crystalline or polycrystalline structure. For example, the horizontal semiconductor layer 100 may be formed by depositing a poly-silicon layer covering an entire top surface of the lower filling insulation layer 50. The poly-silicon layer may be doped with dopants of the first conductivity type during the deposition process thereof. The horizontal semiconductor layer 100 may include a cell array region CAR and a connection region CNR, as described above.

In an embodiment, a buffer insulating layer 111 is subsequently formed by thermally oxidizing a surface of the horizontal semiconductor layer 100. A mold structure 110 which includes sacrificial layers SL and insulating layers ILD alternately stacked in a vertical direction is formed on the buffer insulating layer 111. Here, the sacrificial layers SL may be formed of a material having an etch selectivity with respect to the insulating layers ILD. For example, the sacrificial layers SL may be of a material that is etched at a higher rate than the insulating layers ILD. In an exemplary embodiment, each of the sacrificial layers SL is formed of a silicon nitride layer, and each of the insulating layers ILD is formed of a silicon oxide layer.

In an embodiment, the formation of the mold structure 110 includes forming a thin-layer structure (not shown) including the sacrificial layers SL and the insulating layers ILD alternately stacked on an entire top surface of the horizontal semiconductor layer 100, and performing a trimming process on the thin-layer structure. In an embodiment, the trimming process includes a process of forming a mask pattern (not shown) covering the thin-layer structure on the cell array region CAR and the connection region CNR, a process of etching a portion of the thin-layer structure, a process of reducing a planar area of the mask pattern, and a process of alternately repeating the process of etching a portion of the thin-layer structure and the process of reducing a planar area of the mask pattern. Since the trimming process is performed, the mold structure 110 may have a stepped structure on the connection region CNR of the horizontal semiconductor layer 100. For example, the stepped structure may include layers that progressively become narrower the further they are away from the horizontal semiconductor layer 100.

An upper filling insulation layer 150 is formed on a top surface of the horizontal semiconductor layer 100 after the formation of the mold structure 110. In an embodiment, the upper filling insulation region 150 is formed on the entire top surface of the horizontal semiconductor layer 100. The upper filling insulation layer 150 may have a substantially flat top surface. In an embodiment, a filling insulation layer thicker than the mold structure 110 is deposited on the mold structure 110, and then, a planarization process is performed on the filling insulation layer to form the upper filling insulation layer 150.

Figure 17:
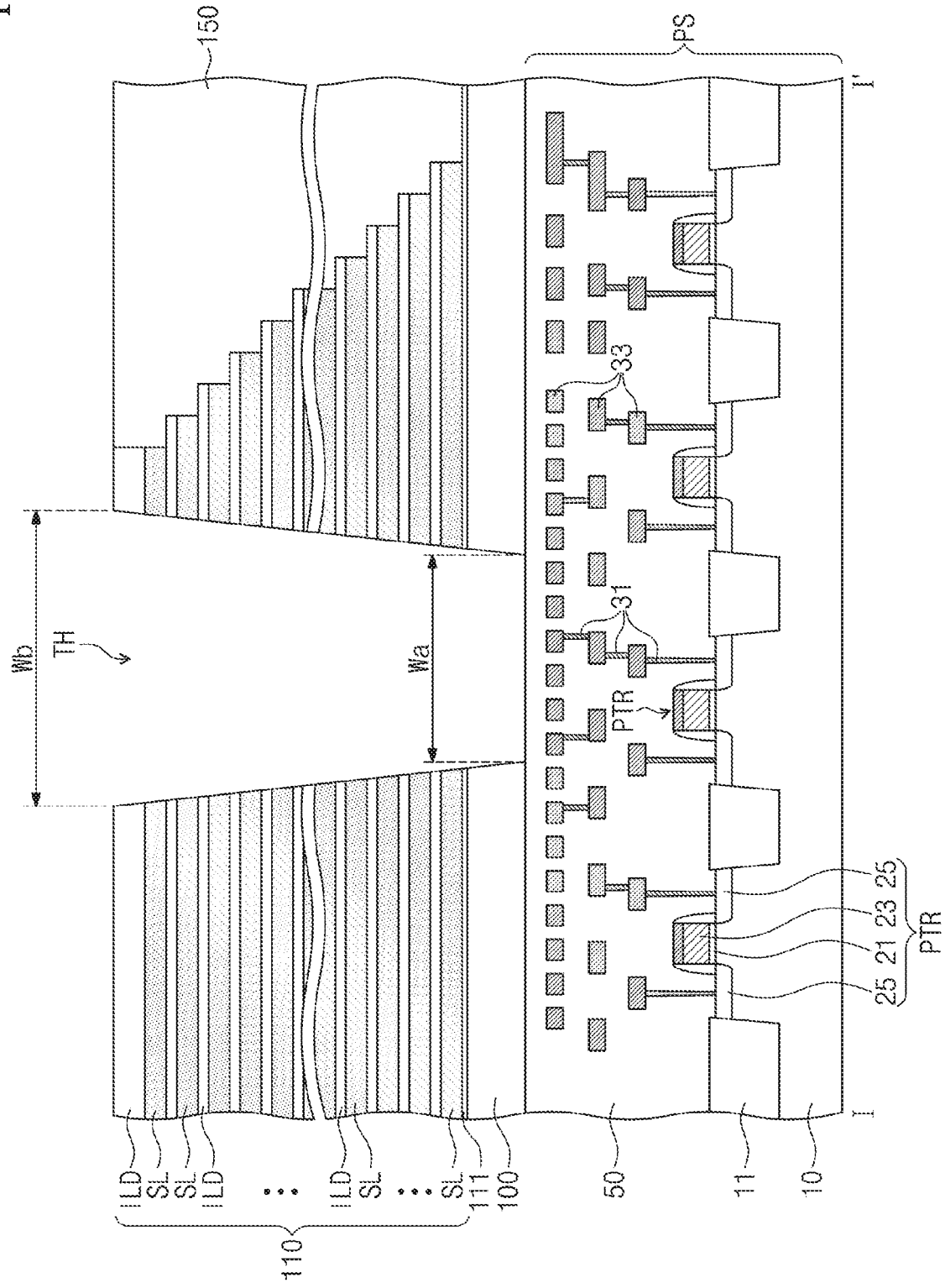

Referring to FIGS. 3 and 17, a through-hole TH is formed to penetrate the mold structure 110 and the horizontal semiconductor layer 100. In an embodiment, the through-hole TH exposes the lower filling insulation layer 50. The through-hole TH may be spaced apart from the stepped structure of the mold structure 110. Alternatively, the through-hole TH may penetrate a portion of the stepped structure of the mold structure 110.

In an embodiment, the formation of the through-hole TH includes forming a mask pattern (not shown) having an opening on the mold structure 110, and anisotropically etching the mold structure 110 and the horizontal semiconductor layer 100 by using the mask pattern as an etch mask. In an embodiment, anisotropically etching is a subtractive microfabrication technique that aims to remove a material in a specific direction to obtain intricate shapes or flat shapes.

In an embodiment, as an integration density of the 3D semiconductor memory device increases, a height of the mold structure 110 increases. Thus, an aspect ratio of the through-hole TH may increase. In an embodiment, a bottom width Wa of the through-hole TH having a high aspect ratio is less than a top width Wb thereof, and thus the through-hole TH may have a tapered shape. In other words, the through-hole TH may have one or more inclined sidewalls.

Figure 18:
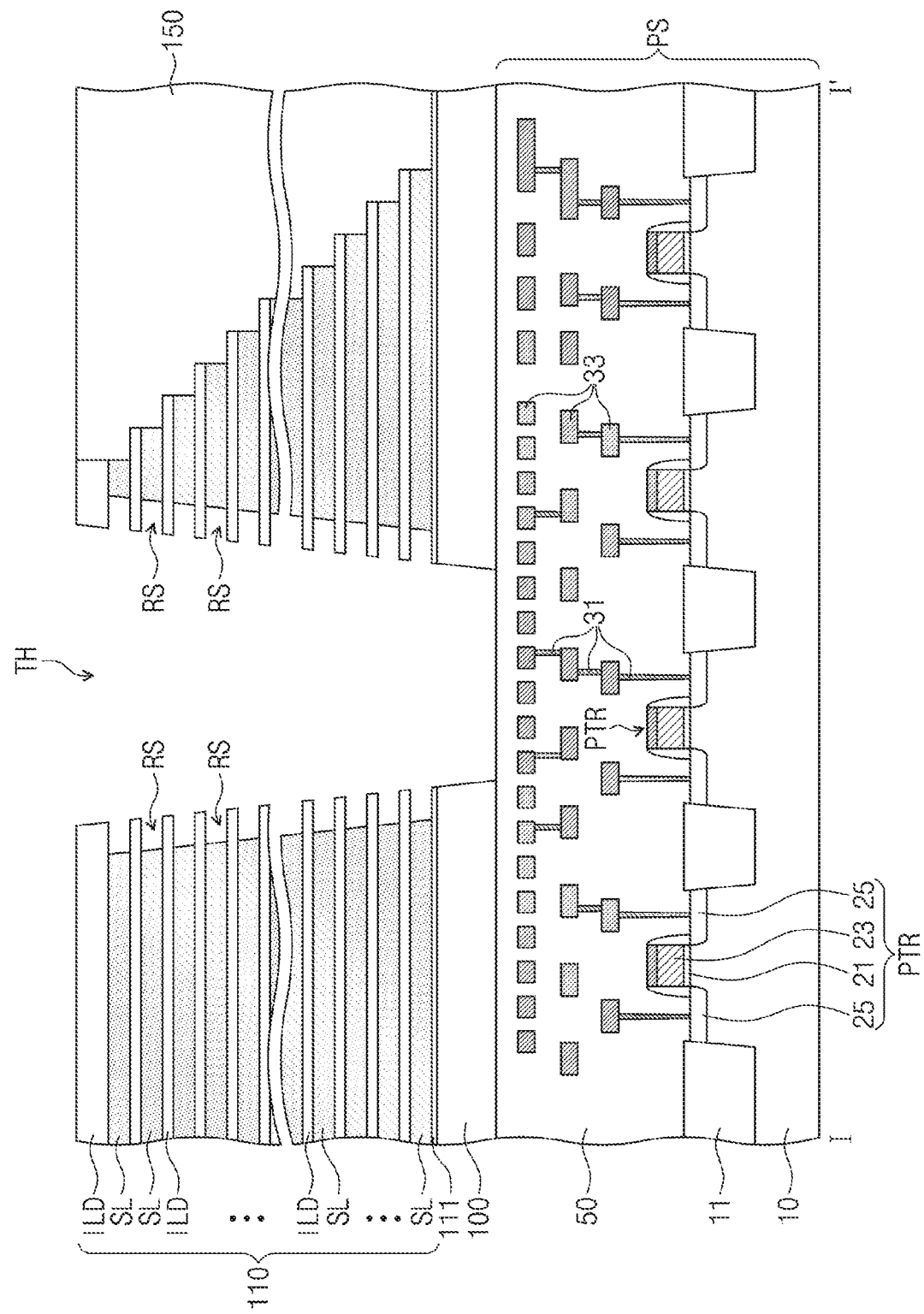

Referring to FIGS. 3 and 18, portions of the sacrificial layers SL exposed by the through-hole TH are removed to form recess regions RS, each of which is defined between the insulating layers ILD vertically adjacent to each other. In other words, the mold structure 110 may have one or more sidewalls in which the recess regions RS are defined.

In an embodiment, the formation of the recess regions RS includes isotropically etching the exposed portions of the sacrificial layers SL by using an etch recipe having an etch selectivity with respect to the insulating layers ILD and the horizontal semiconductor layer 100. Isotropic etching may be referred to as wet etching or chemical etching. In an embodiment, the isotropic etching removes the portions using an etchant solution. For example, when the sacrificial layers SL are silicon nitride layers and the insulating layers ILD and the buffer insulating layer 111 are silicon oxide layers, the isotropic etching process may be performed using an etching solution including phosphoric acid.

Figure 19:
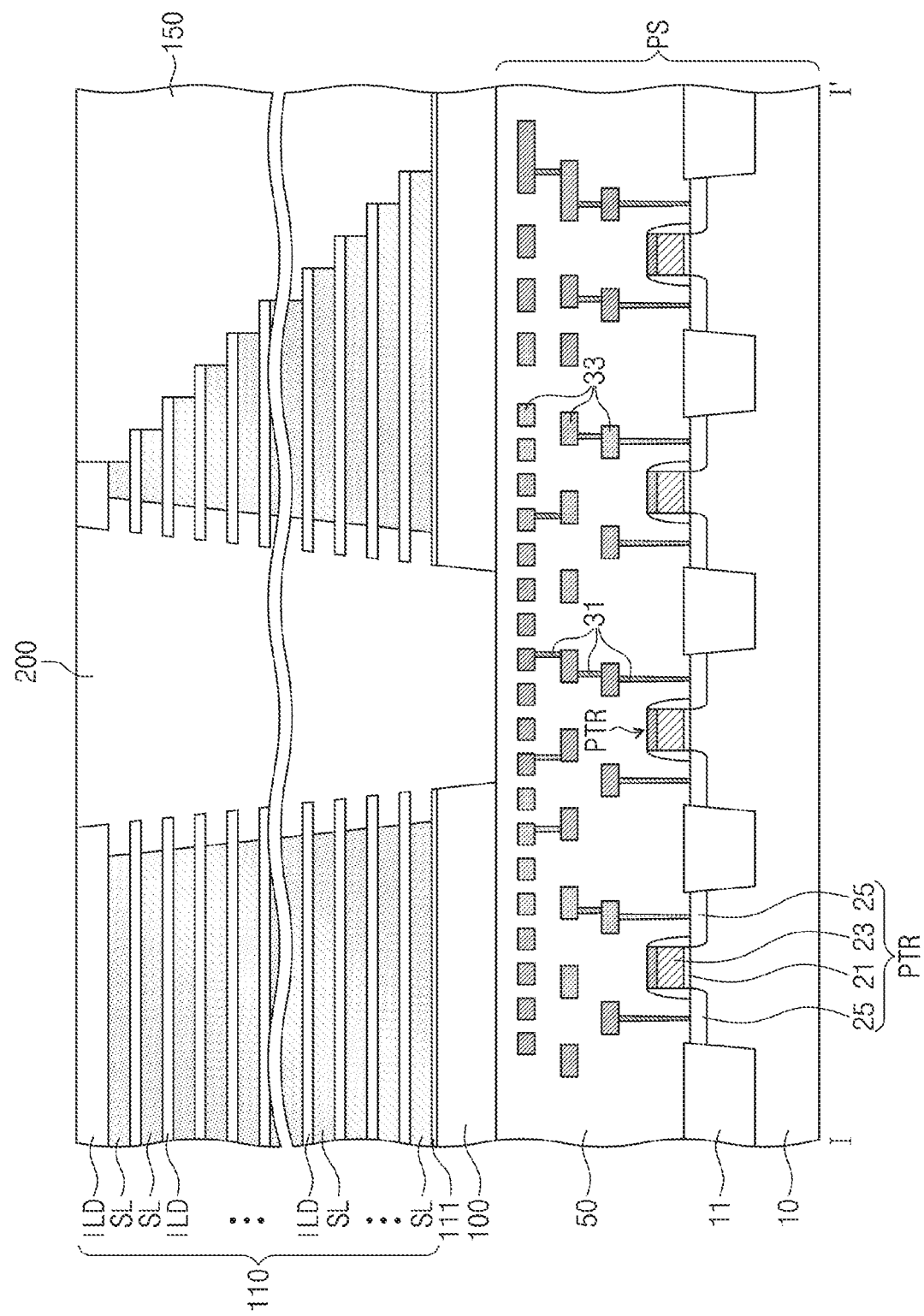

Referring to FIGS. 3 and 19, a through-insulating pattern 200 is formed to fill the recess regions RS and the through-hole TH. In an embodiment, the formation of the through-insulating pattern 200 includes filling the through-hole TH and the recess regions RS with an insulating material and planarizing the insulating material until a top surface of the mold structure 110 is exposed.

In an embodiment, the through-insulating pattern 200 includes an insulating material different from that of the insulating layers ILD of the mold structure 110. For example, the through-insulating pattern 200 may include a high-density plasma (HDP) oxide layer, a tetraethylorthosilicate (TEOS) layer, a plasma enhanced tetraethylorthosilicate (PE-TEOS) layer, an O3-tetraethylorthosilicate (O3-

TEOS) layer, an undoped silicate glass (USG) layer, a phosphosilicate glass (PSG) layer, a borosilicate glass (BSG) layer, a borophosphosilicate glass (BPSG) layer, a fluoride silicate glass (FSG) layer, a spin on glass (SOG) layer, a Tonen silazene (TOSZ) layer, or any combination thereof. In an embodiment, the through-insulating pattern 200 is formed of the SOG layer with excellent gap-fill characteristics. In an embodiment, the insulating layers ILD include the TEOS layers and the through-insulating pattern 200 includes the SOG layer.

Figure 20:
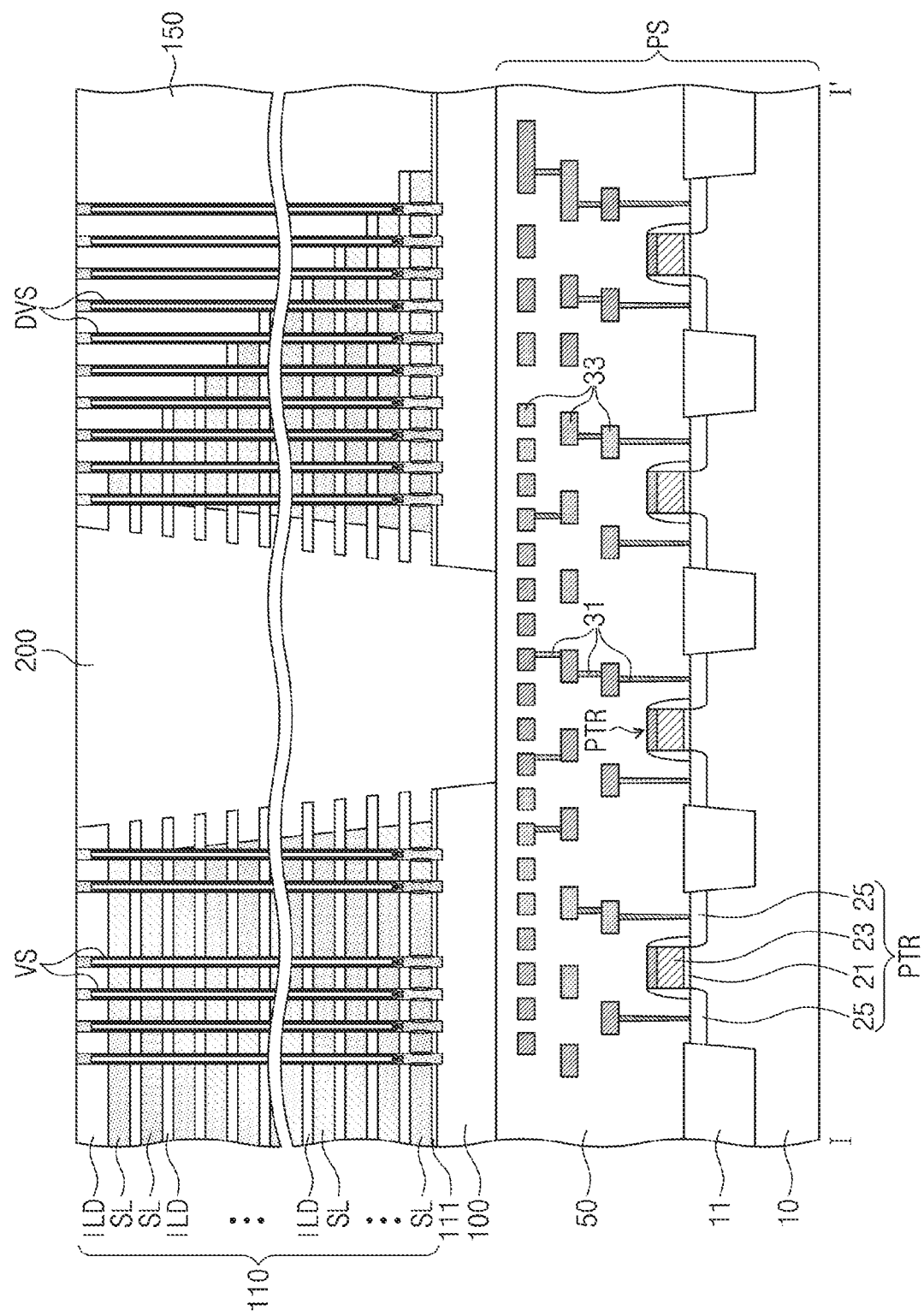

Referring to FIGS. 3 and 20, cell vertical structures VS and dummy vertical structures DVS are formed to penetrate the mold structure 110. In an embodiment, the cell vertical structures VS and dummy vertical structures DVS are spaced apart from the through-insulating pattern 200, and the dummy vertical structures DVS penetrate the stepped structure of the mold structure 110. In an embodiment, the dummy vertical structures DVS have substantially the same structure as the cell vertical structures VS. However, in an exemplary embodiment, widths of the dummy vertical structures DVS is greater than widths of the cell vertical structures VS. Some of the dummy vertical structures may be provided at a boundary between the through-insulating pattern 200 and the mold structure 110 and may penetrate an upper portion of the through-insulating pattern 200.

In an embodiment, the formation of the cell vertical structures VS and the dummy vertical structures DVS includes forming vertical holes which penetrate the mold structure 110 to expose the horizontal semiconductor layer 100, and forming the lower semiconductor pattern LSP and the upper semiconductor pattern USP, described above with reference to FIG. 6A, in each of the vertical holes. In an embodiment, the formation of the lower semiconductor pattern LSP is omitted. In an embodiment, the vertical insulating pattern VP is formed in each of the vertical holes before the formation of the upper semiconductor pattern USP. In an embodiment, the formation of the vertical insulating pattern VP includes depositing a vertical insulating layer and a first semiconductor layer having uniform thicknesses on inner sidewalls of the vertical holes having the lower semiconductor patterns LSP, and anisotropically etching the first semiconductor layer and the vertical insulating layer to expose portions of the lower semiconductor patterns LSP.

Figure 21:
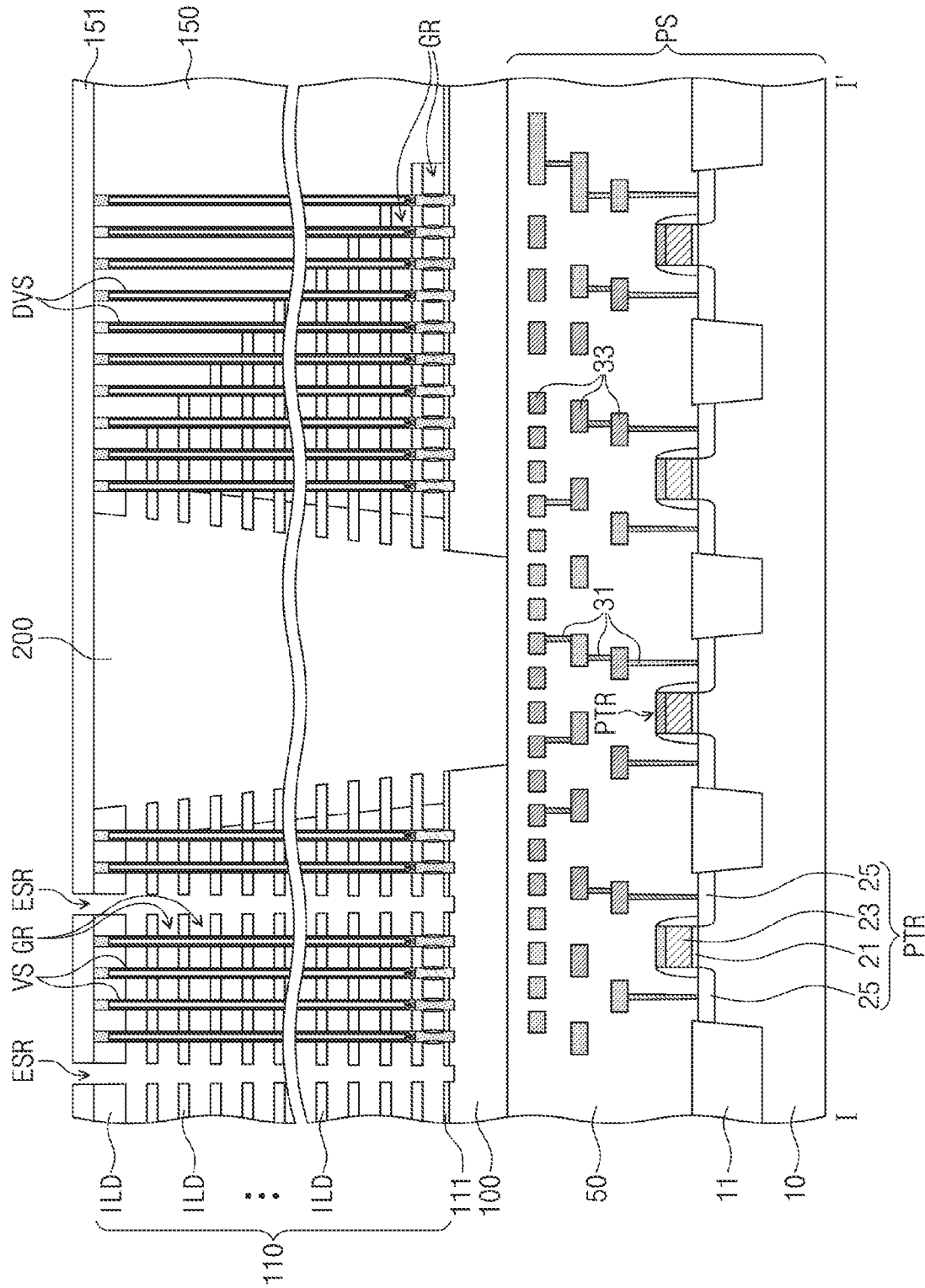

Referring to FIGS. 3 and 21, a first interlayer insulating layer 151 is formed on top surfaces of the vertical structures VS and DVS and the upper filling insulation layer 150. After the formation of the first interlayer insulating layer 151, electrode separation regions ESR are formed to penetrate the first interlayer insulating layer 151 and the mold structure 110. In an embodiment, the electrode separation regions ESR expose the horizontal semiconductor layer 100. In an embodiment, the electrode separation regions ESR are formed by anisotropically etching the first interlayer insulating layer 151 and the mold structure 110. The forming of the electrode separation regions ESR may expose sidewalls of the mold structure 110.

The electrode separation regions ESR may extend from the cell array region CAR onto the connection region CNR in the first direction D1. In an embodiment, lengths, in the first direction D1, of some of the electrode separation regions ESR are shorter than lengths, in the first direction D1, of others of the electrode separation regions ESR. A plurality of sub-mold structures spaced apart from each other in the second direction D2 may be formed by the formation of the electrode separation regions ESR.

Next, the sacrificial layers SL exposed by the electrode separation regions ESR are removed to form gate regions GR. In an embodiment, the gate regions GR are formed by isotropically etching the sacrificial layers SL using an etch recipe having an etch selectivity with respect to the buffer insulating layer 111, the insulating layers ILD, the cell vertical structures VS, the dummy vertical structures DVS, and the horizontal semiconductor layer 100. In an embodiment, the sacrificial layers SL are completely removed by the isotropic etching process. For example, when the sacrificial layers SL are silicon nitride layers and the insulating layers ILD and the buffer insulating layer 111 are silicon oxide layers, the isotropic etching process may be performed using an etching solution including phosphoric acid.

In an embodiment, each of the gate regions GR is an empty space provided between the insulating layers ILD vertically adjacent to each other. The gate regions GR may expose portions of sidewalls of the vertical structures VS and DVS. In addition, the gate regions GR may expose sidewalls of the through-insulating pattern 200.

When the gate regions GR are formed, the cell vertical structures VS and the dummy vertical structures DVS may prevent the insulating layers ILD defining the gate regions GR from collapsing. In addition, protrusions of the through-insulating pattern 200 may prevent the insulating layers ILD adjacent to the through-insulating pattern 200 from collapsing while the gate regions GR are formed.

Figure 22:
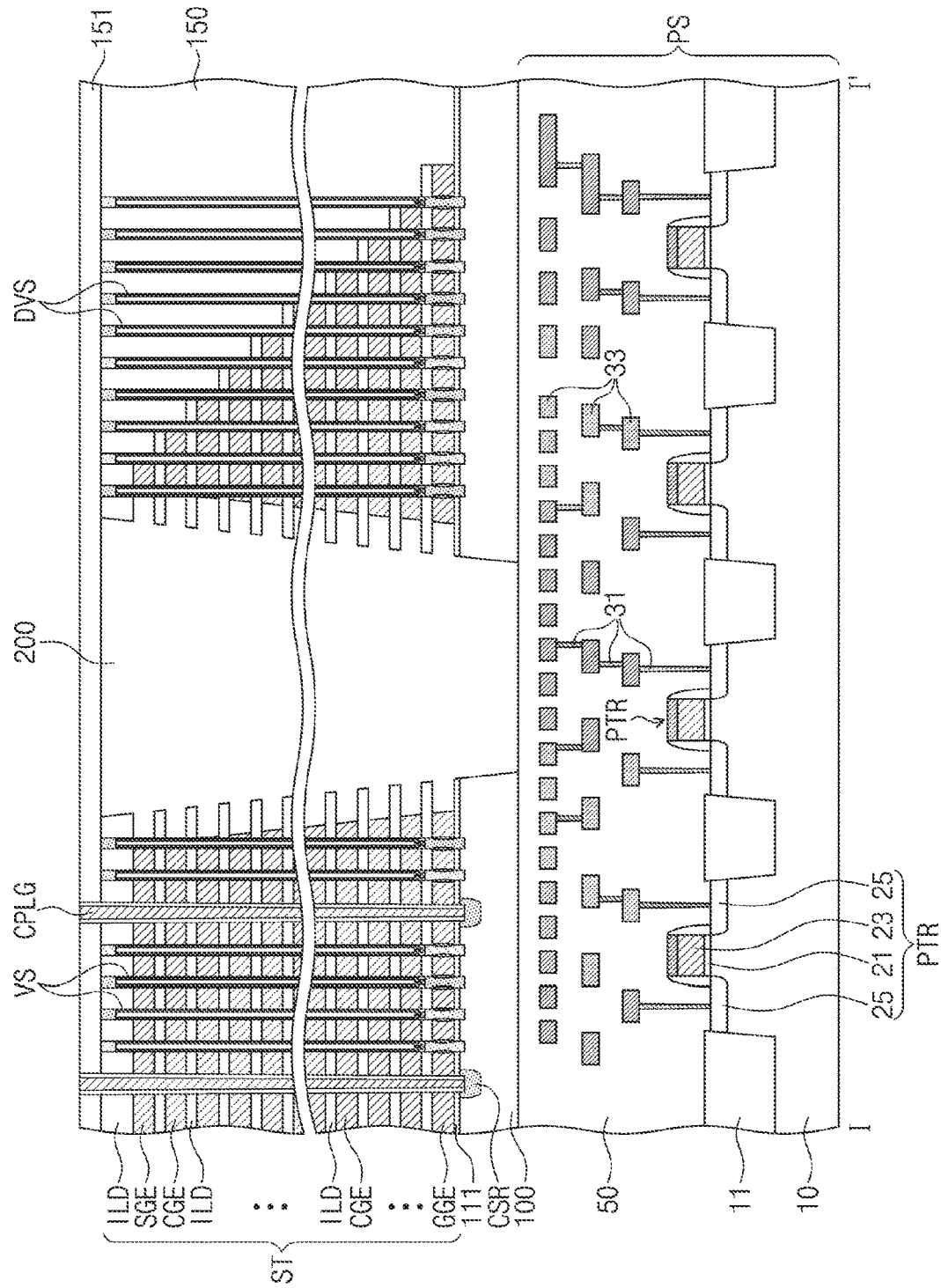

Referring to FIGS. 3 and 22, horizontal insulating patterns (see HP of FIGS. 6A and 6B) and electrodes GGE, CGE and SGE are formed in the gate regions GR, and thus an electrode structure ST is formed on the horizontal semiconductor layer 100.

In an embodiment, a horizontal insulating layer, a barrier metal layer (e.g., Titaniun nitride TiN, Tantalum nitride TaN, or Tungsten nitride WN) and a metal layer (e.g., Tungsten W) are sequentially deposited on the mold structure 110 having the gate regions GR. The barrier metal layer and the metal layer outside the gate regions GR may be removed to form the horizontal insulating patterns HP and the electrodes GGE, CGE and SGE. The horizontal insulating pattern HP may be a portion of a data storage layer of a NAND flash memory device and may include a silicon oxide layer and/or a high-k dielectric layer.

After the formation of the electrodes GGE, CGE and SGE, common source regions CSR are formed in the horizontal semiconductor layer 100 exposed by the electrode separation regions ESR, and then, the electrode separation regions ESR are filled with an insulating material SS. For example, the common source regions CSR may include N-type dopants (e.g., arsenic (As) or phosphorus (P)). Subsequently, common source plugs CPLG are formed to penetrate the insulating material SS filling the electrode separation regions ESR. The common source plugs CPLG are connected to the common source regions CSR.

Figure 23:
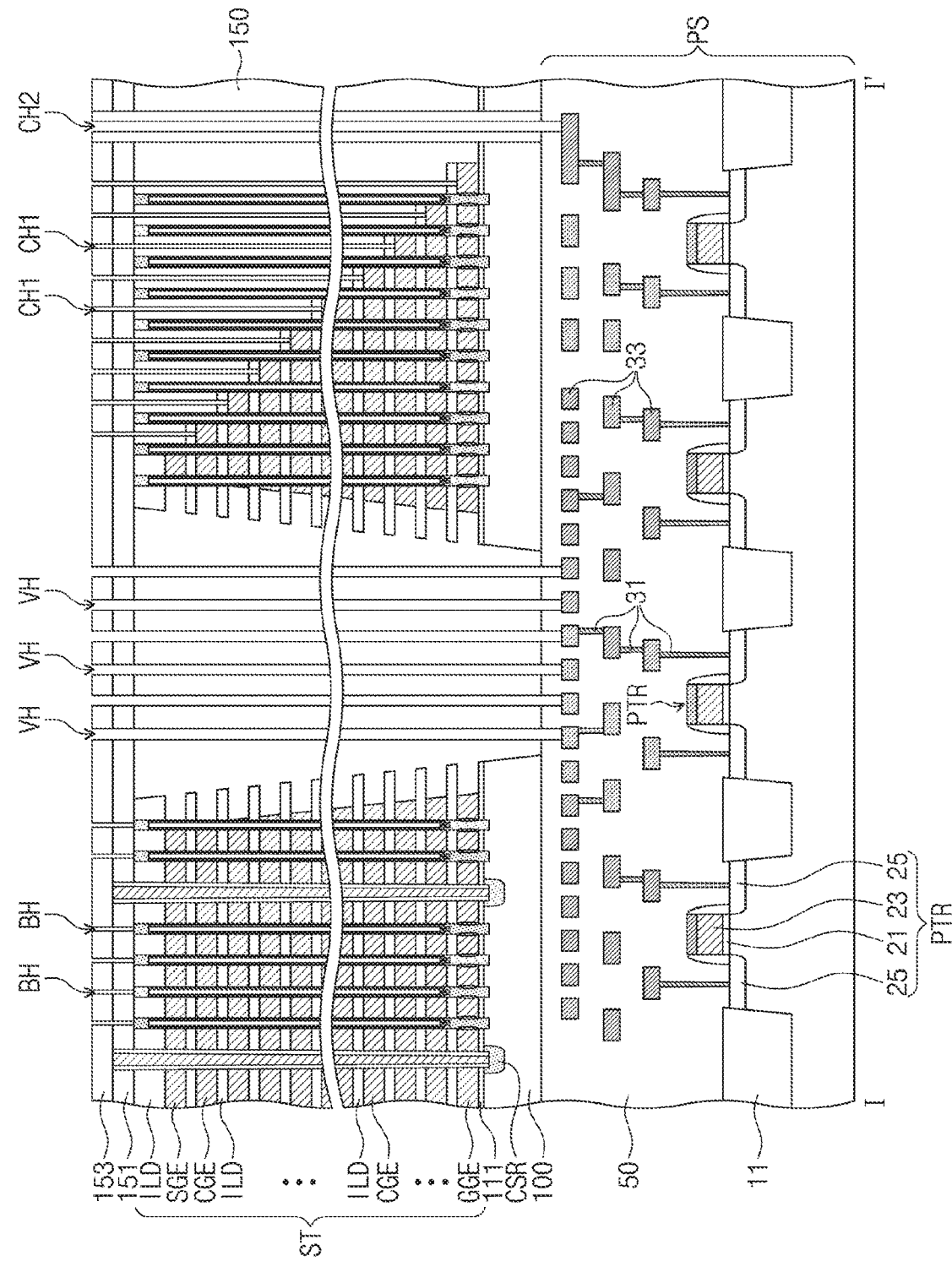

Referring to FIGS. 3 and 23, a second interlayer insulating layer 153 is formed on the first interlayer insulating layer 151. In an exemplary embodiment, a patterning process is next performed on the second and first interlayer insulating layers 153 and 151, the through-insulating pattern 200, and the upper filling insulation layer 150 to form contact holes VH, CH1, CH2 and BH.

In an embodiment, via holes VH penetrate the first and second interlayer insulating layers 151 and 153 and the through-insulating pattern 200 to expose the peripheral circuit interconnection lines 33. In an embodiment, cell contact holes CH1 penetrate the first and second interlayer insulating layers 151 and 153 and the upper filling insulation layer 150 on the connection region CNR to expose end portions of the electrodes SGE, CGE and GGE, respectively. Connection contact holes CH2 may be spaced apart from the electrode structure ST. In an embodiment, the connection contact holes CH2 expose the peripheral circuit interconnection lines 33. In an embodiment, bit line contact holes BH expose the cell vertical structures VS on the cell array region CAR.

In an embodiment, the contact holes VH, CH1, CH2 and BH are subsequently filled with a conductive material, thereby forming the bit line contact plugs BPLG, the through-plugs TPLG, the contact plugs PLGa and PLGb and the connection contact plugs PPLG, described with reference to FIGS. 5A and 5B. For example, filling the bit line contact holes BH forms the bit line contact plugs BPLG, filling the via holes VH forms the through-plugs TPLG, filling the cell contact holes CH1 forms the contact plugs PLGa and PLGb, and filling the contact holes CH2 forms the connection contact plugs PPLG. Thereafter, the bit lines BL and the first and second conductive lines CLa and CLb described above are formed on the second interlayer insulating layer 153.

FIGS. 24 to 28 are cross-sectional views illustrating a method of manufacturing a 3D semiconductor memory device, according to an exemplary embodiment of the inventive concept. Hereinafter, the descriptions to the same technical features as in the above embodiments of FIGS. 16 to 23 will be omitted or mentioned briefly for ease and convenience of explanation.

Figure 24:
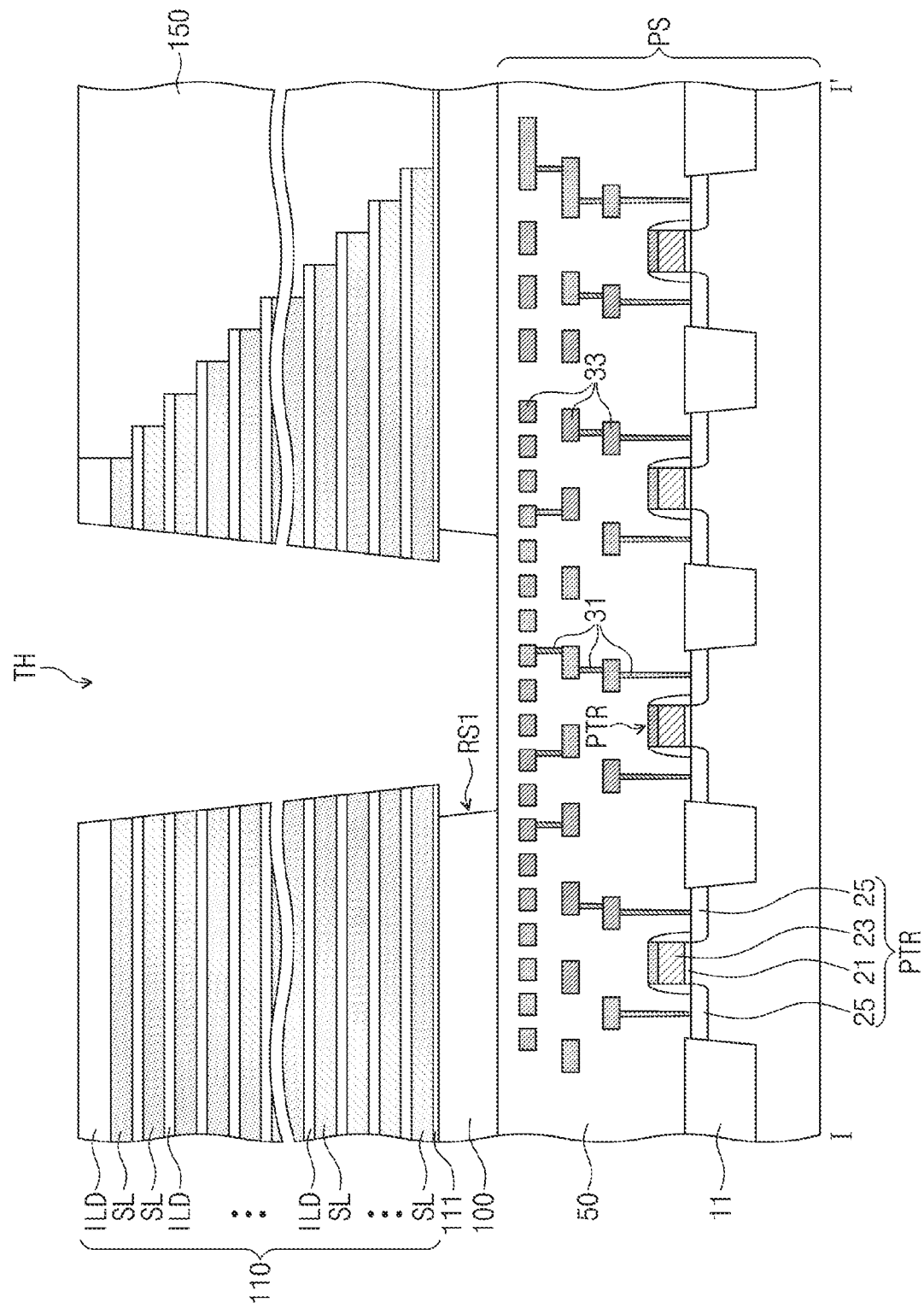
FIGS. 24 to 28 are cross-sectional views illustrating a method of manufacturing a 3D semiconductor memory device, according to an exemplary embodiment of the inventive concept.

Referring to FIG. 24, the through-hole TH is formed to penetrate the mold structure 110 and the horizontal semiconductor layer 100 as described above with reference to FIG. 17, and then, a sidewall of the horizontal semiconductor layer 100 exposed by the through-hole TH is laterally or horizontally recessed to form a lower recess region RS1.

In an embodiment, the formation of the lower recess region RS1 includes a process of etching a portion of the horizontal semiconductor layer 100 by using an etch recipe having an etch selectivity with respect to the buffer insulating layer 111, the sacrificial layers SL, the insulating layers ILD, and the lower filling insulation layer 50. The process of etching the horizontal semiconductor layer 100 may use a chemical and physical etching method such as a reactive ion etching (RIE) method, a wet etching method using an etchant, a chemical pyrolysis etching method (e.g., a gas-phase etching (GPE) method), or any combination thereof.

The lower recess region RS1 may be defined by a bottom surface of the buffer insulating layer 111, a top surface of the lower filling insulation layer 50, and the recessed sidewall of the horizontal semiconductor layer 100. For example, part of the bottom surface of the buffer insulating layer 111 contacts the horizontal semiconductor layer 100 and another part of the bottom surface of the buffer insulating layer 111 is exposed by the lower recess region RS1. Since the lower recess region RS1 is formed, a bottom width of the through-hole TH exposing the lower filling insulation layer 50 is increased.

Figure 25:
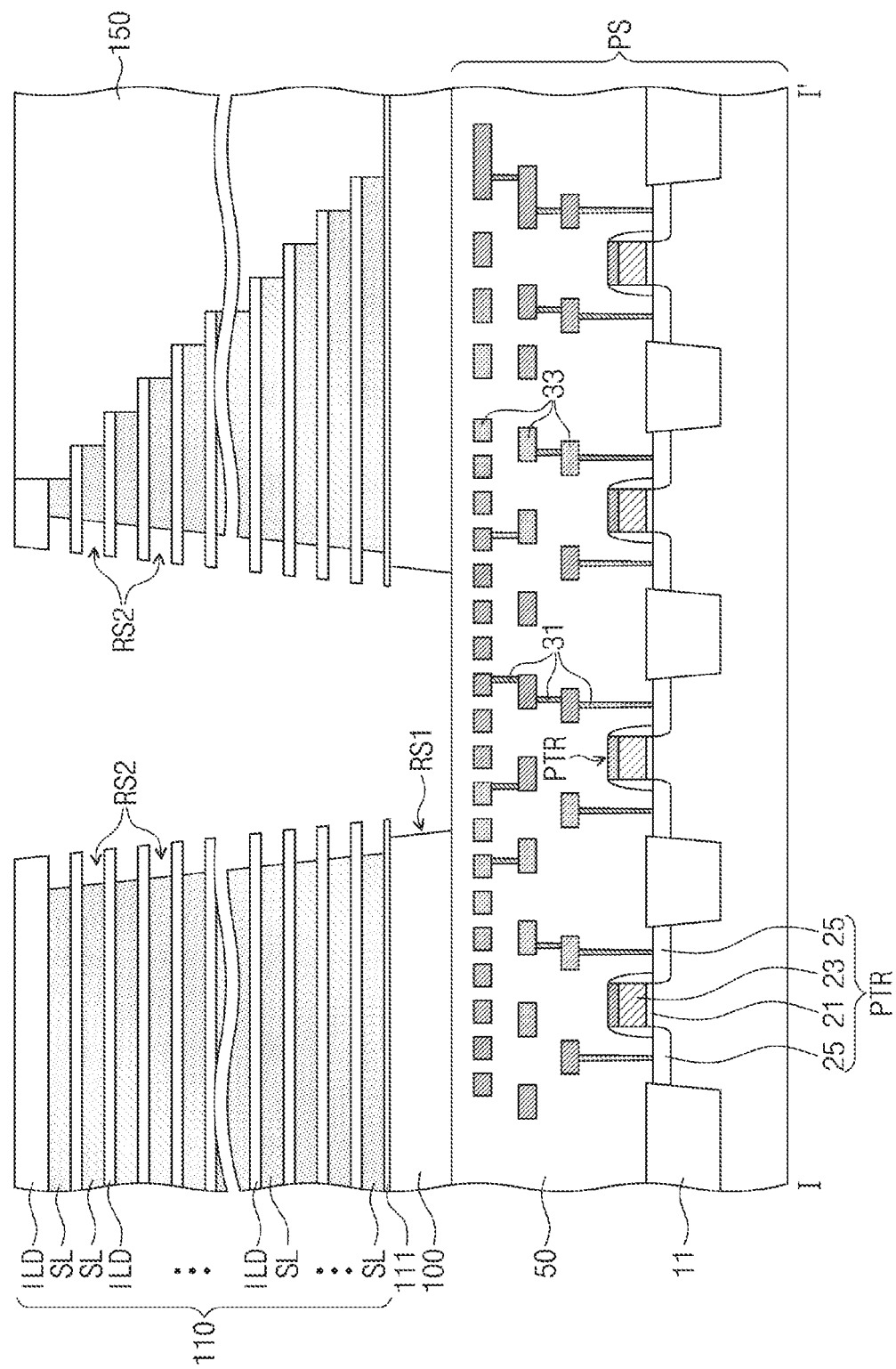

On the other hand, as illustrated in FIG. 25, before or after the formation of the lower recess region RS1, upper recess regions RS2 are formed between the insulating layers ILD as described above with reference to FIG. 18.

Figure 26:
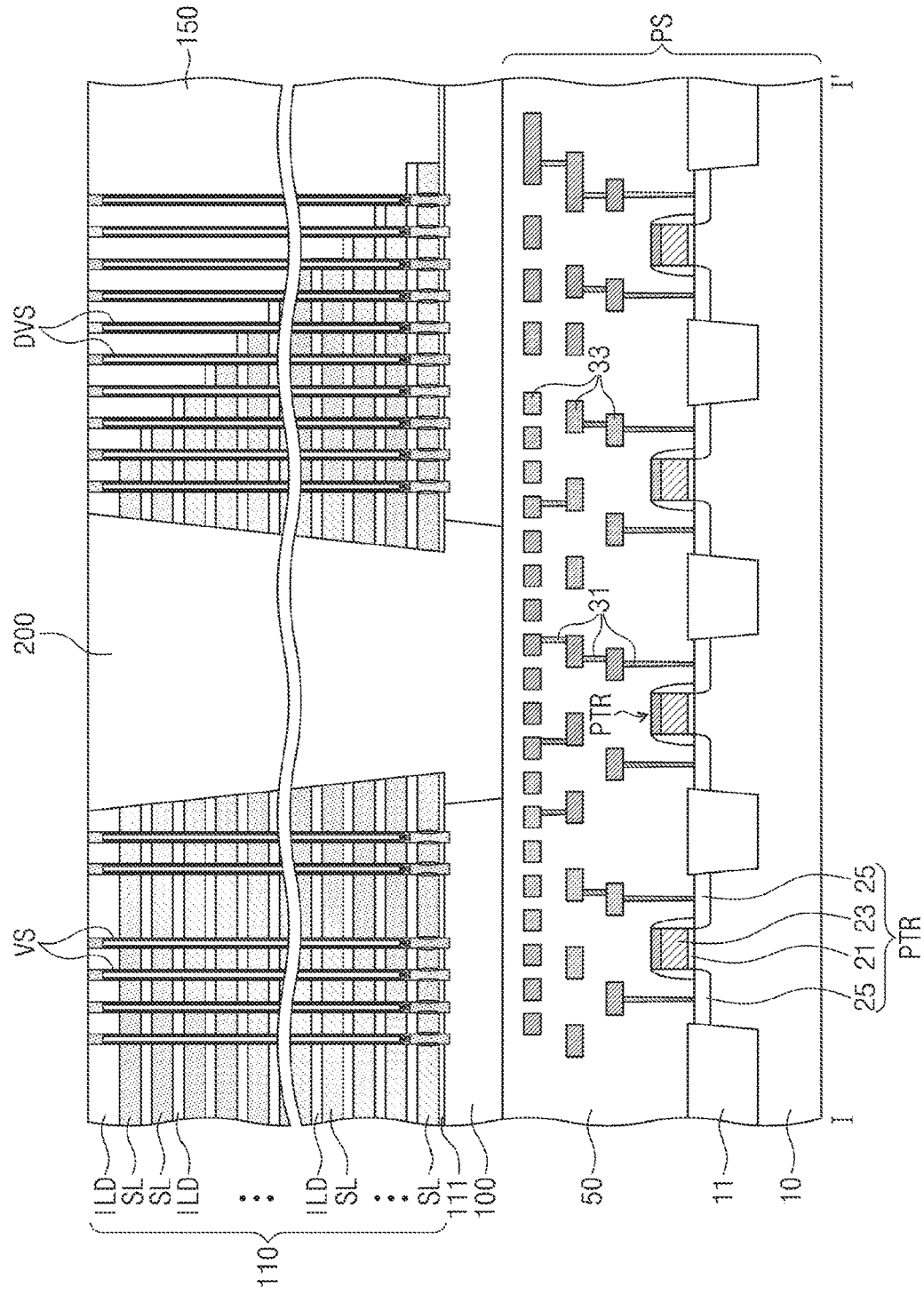

Referring to FIG. 26, after the formation of the lower recess region RS1 of FIG. 24, a through-insulating pattern 200 is formed to fill the lower recess region RS1 and the through-hole TH. In the present embodiment, a bottom width of the through-insulating pattern 200 is greater than a top width of the through-insulating pattern 200. Next, the cell vertical structures VS and dummy vertical structures DVS are formed to penetrate the mold structure 110, as described above with reference to FIG. 20.

Figure 27:
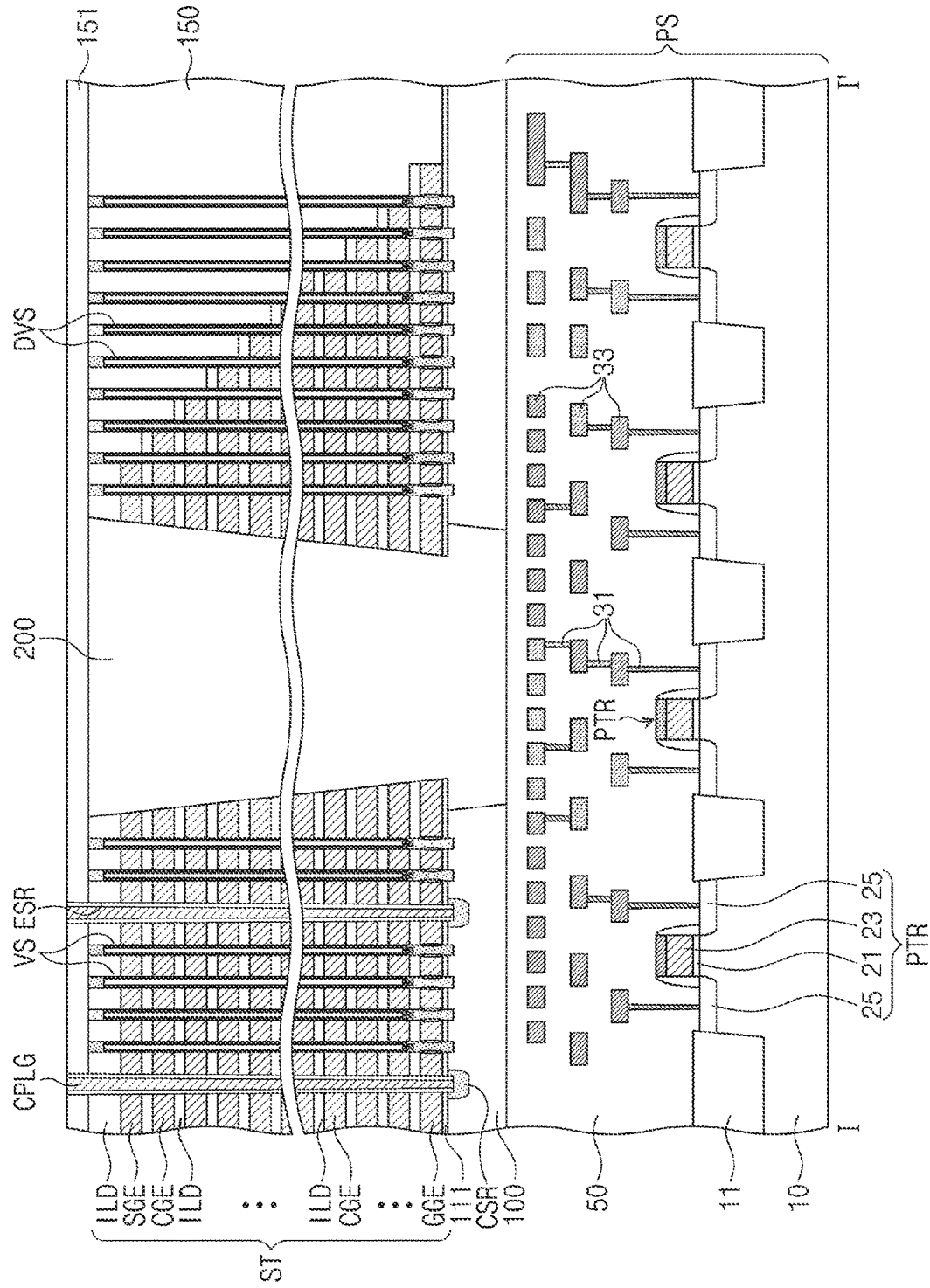

Referring to FIG. 27, a first interlayer insulating layer 151 is formed after the formation of the cell vertical structures VS and the dummy vertical structures DVS. The first interlayer insulating layer 151 may cover the top surfaces of the cell vertical structures VS and the dummy vertical structures DVS and the upper filling insulation layer 150.

Subsequently, as described above with reference to FIGS. 21 and 22, the sacrificial layers SL are replaced with the electrodes GGE, CGE and SGE, and thus the electrode structure ST in which the electrodes GGE, CGE and SGE and the insulating layers ILD are alternately stacked in the vertical direction is formed on the horizontal semiconductor layer 100.

Figure 28:
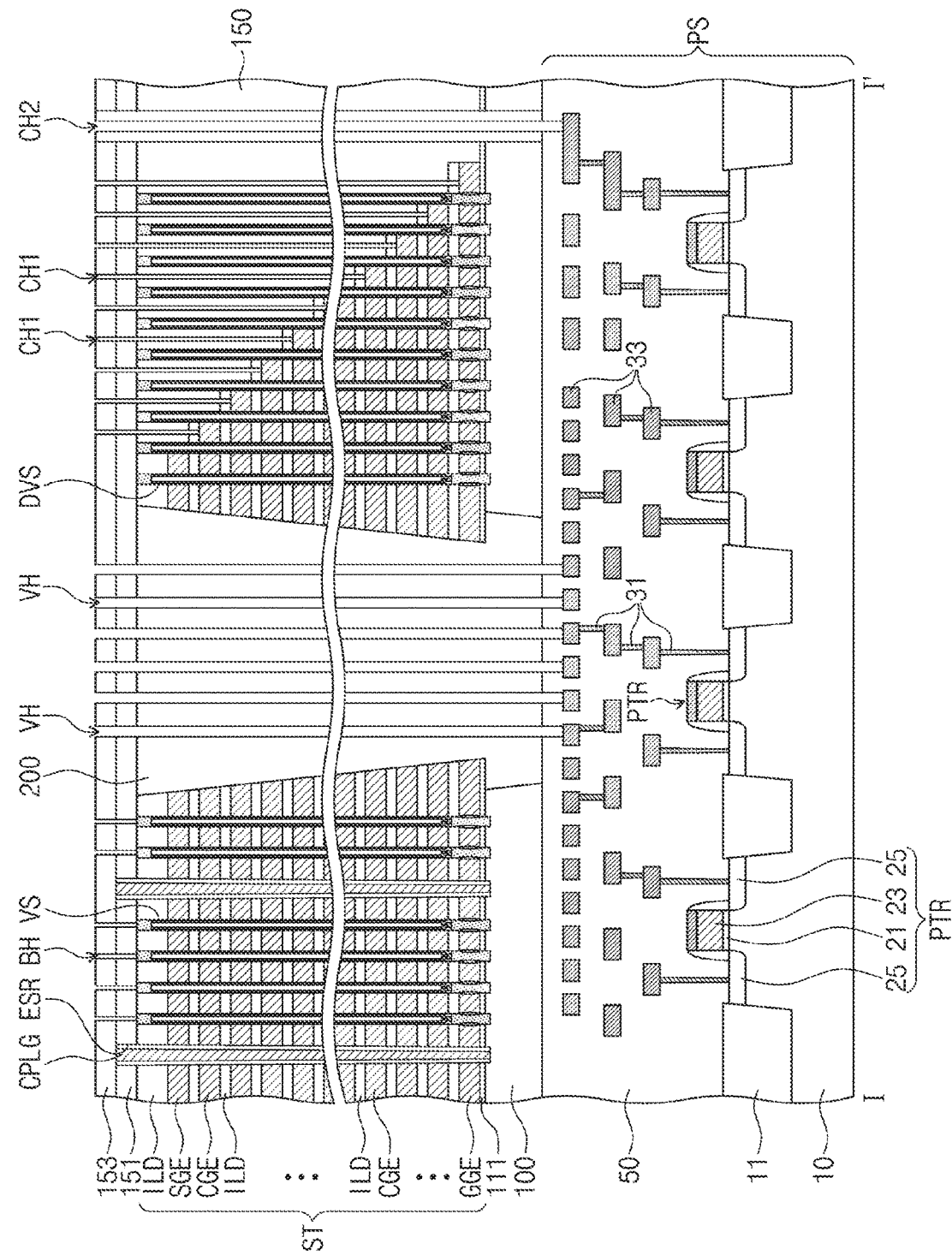

Referring to FIG. 28, a second interlayer insulating layer 153 is formed on the first interlayer insulating layer 151. Next, the via holes VH, the connection contact holes CH2, the cell contact holes CH1 and the bit line contact holes BH are formed as described with reference to FIG. 23.

According to an exemplary embodiment, since the sidewall of the horizontal semiconductor layer 100 is laterally recessed from the sidewalls of at least some insulating layers ILD of the electrode structure ST, distances between the horizontal semiconductor layer 100 and the via holes VH are increased when the via holes VH are formed. Thus, a process margin of the process of forming the via holes VH may be increased. In addition, the lateral recessing of the sidewall of the horizontal semiconductor layer 100 may prevent or reduce an electrical short between the horizontal semiconductor layer 100 and the through-plugs TPLG formed in the via holes VH.

According to an exemplary embodiment of the inventive concept, the sidewalls of the electrodes and the sidewall of the horizontal semiconductor layer are laterally recessed from the sidewalls of the insulating layers, and thus it is possible to increase the distances between the through-plug and the electrodes and the distance between the through-plug and the horizontal semiconductor layer. In an embodiment, the through-plug connects the cell array structure to the peripheral logic structure disposed under the cell array structure. As a result, it is possible to prevent an electrical short between the through-plug and the electrode structure and an electrical short between the through-plug and the horizontal semiconductor layer.

In an embodiment, the through-insulating pattern of the through-interconnection structure includes protrusions laterally protruding toward the electrodes of the electrode structure. The protrusions of the through-insulating pattern may be provided between the insulating layers to support the insulating layers while the 3D semiconductor memory device is manufactured. As a result, the through-interconnection structure may prevent the mold structure adjacent thereto from collapsing.

While the inventive concept has been described with reference to exemplary embodiments thereof, it will be apparent to those skilled in the art that various changes and modifications may be made to these embodiments without departing from the spirit and scope of the inventive concept.

What is claimed is:
1. A three-dimensional (3D) semiconductor memory device comprising:
a peripheral logic structure comprising a plurality of peripheral logic circuits disposed on a semiconductor substrate;

a horizontal semiconductor layer disposed on the peripheral logic structure;
an electrode structure comprising a plurality of electrodes and insulating layers vertically and alternately stacked on the horizontal semiconductor layer; and
a through-interconnection structure penetrating the electrode structure and the horizontal semiconductor layer and comprising a through-plug connected to the peripheral logic structure,
wherein a sidewall of a first insulating layer of the insulating layers is spaced apart from the through-plug by a first distance, and wherein a sidewall of a first electrode of the electrodes is spaced apart from the through-plug by a second distance greater than the first distance,
wherein the through-interconnection structure further comprises a through-insulating pattern made entirely of a single insulating material contacting the through-plug, the through-insulating pattern having protrusions that extend from the through-insulating pattern towards the electrodes to entirely fill recesses between the insulating layers.

2. The 3D semiconductor memory device of claim 1, wherein a sidewall of the horizontal semiconductor layer is spaced apart from the through-plug by a third distance, and the third distance is greater than a minimum distance between a sidewall of the electrode structure and the through-plug.

3. The 3D semiconductor memory device of claim 2, wherein the third distance between the sidewall of the horizontal semiconductor layer and the through-plug is different from the second distance.

4. The 3D semiconductor memory device of claim 1, wherein the horizontal semiconductor layer is closer to the first electrode than the first insulating layer.

5. The 3D semiconductor memory device of claim 1, wherein a distance between the through-plug and a second insulating layer corresponding to an uppermost one of the insulating layers is greater than the first distance.

6. The 3D semiconductor memory device of claim 1, wherein distances between the through-plug and sidewalls of the electrodes increase as a vertical distance from the horizontal semiconductor layer to each of the electrodes increases.

7. The 3D semiconductor memory device of claim 1, wherein distances between the through-plug and sidewalls of the insulating layers increase as a vertical distance from the horizontal semiconductor layer to each of the insulating layers increases.

8. The 3D semiconductor memory device of claim 1, wherein a bottom width of a bottom surface of the through-insulating pattern is less than a top width of a top surface of the through-insulating pattern.

9. The 3D semiconductor memory device of claim 1, wherein the insulating layers of the electrode structure include a first insulating material, and wherein the through-insulating pattern includes a second insulating material different from the first insulating material.

10. The 3D semiconductor memory device of claim 1, wherein the horizontal semiconductor layer includes a cell array region and a connection region, wherein the electrode structure extends from the cell array region onto the connection region and has a stepped structure on the connection region, and wherein the through-interconnection structure is spaced apart from the stepped structure of the electrode structure.

11. The 3D semiconductor memory device of claim 10, further comprising:
cell vertical structures penetrating the electrode structure on the cell array region; and
dummy vertical structures penetrating the stepped structure of the electrode structure on the connection region, wherein each of the cell and dummy vertical structures comprises:
a semiconductor pattern connected to the horizontal semiconductor layer; and
a data storage pattern surrounding a sidewall of the semiconductor pattern.

12. The 3D semiconductor memory device of claim 1, further comprising: contact plugs connected to the electrodes of the electrode structure; and a conductive line connecting the through-plug to one of the contact plugs.

13. A three-dimensional (3D) semiconductor memory device comprising:
a peripheral logic structure comprising a plurality of peripheral logic circuits disposed on a semiconductor substrate;
a horizontal semiconductor layer disposed on the peripheral logic structure;
an electrode structure comprising a plurality of electrodes and insulating layers which are vertically and alternately stacked on the horizontal semiconductor layer, the electrode structure having a plurality of recess regions between the insulating layers vertically adjacent to each other;
a through-insulating pattern made entirely of a single first insulating material penetrating a portion of the electrode structure and a portion of the horizontal semiconductor layer and entirely filling the recess regions of the electrode structure; and
a plurality of through-plugs penetrating the through-insulating pattern and connected to the peripheral logic structure,
wherein the through-insulating pattern further comprises protrusions that extend from the through-insulating pattern towards the electrode structure to entirely fill recesses between the insulating layers.

14. The 3D semiconductor memory device of claim 13, wherein a sidewall of the horizontal semiconductor layer is spaced apart from a first through-plug of the through-plugs by a first distance, and wherein a sidewall of a lowermost electrode of the electrodes is spaced apart from the first through-plug by a second distance different from the first distance.

15. The 3D semiconductor memory device of claim 14, wherein the first distance is greater than a minimum distance between the first through-plug and a sidewall of the electrode structure, which has the recess regions.

16. The 3D semiconductor memory device of claim 13, wherein the insulating layers of the electrode structure include a second insulating material different from the first insulating material of the through-insulating pattern.

17. The 3D semiconductor memory device of claim 13, wherein a bottom width of a bottom surface of the through-insulating pattern is less than a top width of a top surface of the through-insulating pattern.

18. The 3D semiconductor memory device of claim 13, wherein distances between the through-plugs and the recessed sidewalls of the electrodes increase as a vertical distance from the horizontal semiconductor layer to each of the electrodes increases.

19. A three-dimensional (3D) semiconductor memory device comprising:

a peripheral logic structure comprising a plurality of peripheral logic circuits disposed on a semiconductor substrate;

a horizontal semiconductor layer disposed on the peripheral logic structure, an electrode structure comprising a plurality of electrodes and insulating layers vertically and alternately stacked on the horizontal semiconductor layer; and a through-interconnection structure penetrating the electrode structure and the horizontal semiconductor layer and comprising, a through-plug connected to the peripheral logic structure, wherein the through-plug is spaced apart from a sidewall of the horizontal semiconductor layer by a first distance, and the first distance is greater than a minimum distance between a sidewall of the electrode structure and the through-plug, and wherein the through-interconnection structure further comprises a through-insulating pattern made entirely of a single insulating material contacting the through-plug, the through-insulating pattern having protrusions that extend from the through-insulating pattern towards the electrode structure to entirely fill recesses between the insulating layers.

* * * * *